(12) United States Patent
Biberger et al.

(10) Patent No.: US 8,471,202 B2
(45) Date of Patent: Jun. 25, 2013

(54) METHOD FOR PRODUCING A REPRESENTATION OF AN OBJECT BY MEANS OF A PARTICLE BEAM, AS WELL AS A PARTICLE BEAM DEVICE FOR CARRYING OUT THE METHOD

(75) Inventors: Josef Biberger, Wildenberg (DE); Ralph Pulwey, Aalen (DE); Ernst Draszba, Wittislingen (DE); Klaus Hegele, Aalen (DE); Harald Niebel, Oberkochen (DE); Andreas Adolf, Aalen (DE); Rainer Arnold, Ulm (DE)

(73) Assignee: Carl Zeiss Microscopy GmbH, Jena (DE)

( * ) Notice: Subject to any disclaimer, the term of this patent is extended or adjusted under 35 U.S.C. 154(b) by 0 days.

(21) Appl. No.: 12/930,046

(22) Filed: Dec. 22, 2010

(65) Prior Publication Data

US 2011/0198497 A1 Aug. 18, 2011

Related U.S. Application Data

(60) Provisional application No. 61/398,146, filed on Jun. 21, 2010.

(30) Foreign Application Priority Data

Dec. 23, 2009 (DE) .................. 10 2009 055 271

(51) Int. Cl.
*G01N 23/00* (2006.01)
(52) U.S. Cl.
USPC .......................................... 250/307; 250/306

(58) Field of Classification Search
USPC .......... 250/306, 307, 310, 311, 492.1, 492.2, 250/492.23, 492.3
See application file for complete search history.

(56) References Cited

U.S. PATENT DOCUMENTS

| | | | |
|---|---|---|---|
| 5,981,948 A | 11/1999 | Taniguchi et al. | |
| 6,649,919 B2 * | 11/2003 | Chao et al. | 250/492.2 |
| 6,884,992 B1 | 4/2005 | Heiland | |
| 6,924,484 B1 * | 8/2005 | Wang et al. | 850/9 |
| 7,160,475 B2 * | 1/2007 | Scipioni | 216/2 |
| 8,093,567 B2 * | 1/2012 | Lagarec et al. | 250/492.21 |
| 2001/0052781 A1 | 12/2001 | Nozoe et al. | |
| 2005/0177633 A1 * | 8/2005 | Plunkett | 709/225 |
| 2006/0043312 A1 * | 3/2006 | Siebert et al. | 250/398 |
| 2006/0219902 A1 * | 10/2006 | De Robillard | 250/307 |
| 2007/0210250 A1 * | 9/2007 | Ward et al. | 250/307 |
| 2007/0284537 A1 * | 12/2007 | Zani et al. | 250/398 |
| 2010/0163727 A1 * | 7/2010 | Bell et al. | 250/307 |
| 2011/0084207 A1 * | 4/2011 | Zhang et al. | 250/307 |

* cited by examiner

*Primary Examiner* — Robert Kim
*Assistant Examiner* — Jason McCormack
(74) *Attorney, Agent, or Firm* — Muirhead and Saturnelli, LLC

(57) ABSTRACT

A method for producing a representation of an object using a particle beam, as well as a particle beam device for carrying out the method are disclosed. The system described herein is based on the object of specifying the method and the particle beam device for producing a representation of an object such that images which are produced, in particular including FFT images, are as free as possible of artifacts which are not caused by the object to be examined. This is achieved in particular in that pixel lives, line flyback times and pixel pause times are varied in raster patterns.

23 Claims, 16 Drawing Sheets

METHOD FOR PRODUCING A REPRESENTATION OF AN OBJECT BY MEANS OF A PARTICLE BEAM, AS WELL AS A PARTICLE BEAM DEVICE FOR CARRYING OUT THE METHOD

RELATED APPLICATIONS

This application claims priority to U.S. Provisional App. No. 61/398,146 filed Jun. 21, 2010, which is incorporated herein by reference.

TECHNICAL FIELD

This application relates to a method for producing a representation of an object using a particle beam and to a particle beam device for carrying out the method.

BACKGROUND OF THE INVENTION

Electron beam devices, in particular a scanning electron microscope (also referred to in the following text as SEM) and/or a transmission electron microscope (also referred to in the following text as TEM), are used to examine objects (samples) in order to obtain knowledge about the characteristics and behavior of objects in specific conditions.

In the case of an SEM, an electron beam (also referred to in the following text as a primary electron beam) is produced using a beam generator and is focused by a beam guidance system onto an object to be examined. The primary electron beam is guided in a raster shape using a deflection device over a surface of the object to be examined. The electrons in the primary electron beam in this case interact with the object to be examined. As a consequence of the interaction, in particular electrons are emitted from the surface of the object to be examined (so-called secondary electrons) and electrons in the primary electron beam are scattered back (so-called back-scattered electrons). The secondary electrons and back-scattered electrons are detected and are used for image production. An image of the surface of the object to be examined is thus obtained.

Furthermore, it is known from the prior art for combination devices to be used to examine objects, in which both electrons and ions can be passed to an object to be examined. By way of example, it is known for an SEM to additionally be equipped with an ion beam column. An ion beam generator which is arranged in the ion beam column is used to produce ions which are used for preparation of an object (for example etching of the object or application of material to the object), or else for imaging. In this case, the SEM is used in particular to observe the preparation, or else for further examination of the prepared or unprepared object.

In the case of a TEM, a primary electron beam is likewise produced using a beam generator and is passed to an object to be examined using a beam guidance system. The primary electron beam passes through the object to be examined. When the primary electron beam passes through the object to be examined, the electrons in the primary electron beam interact with the material of the object to be examined. The electrons passing through the object to be examined are imaged onto a phosphor screen using a system comprising an objective and a projection lens, or are detected by a position-resolving detector (for example a camera). In addition, for this purpose, it is possible to provide for back-scattered electrons on the object to be examined and/or secondary electrons emitted from the object to be examined to be detected using a further detector, in order to image an object to be examined.

The abovementioned imaging is in this case carried out in the scanning mode of a TEM. In this case, the primary electron beam of the TEM is focused on the object to be examined, in a similar manner to that in the case of an SEM, and is guided in a raster shape over the object to be examined, using a deflection device. A TEM such as this is generally referred to as an STEM. Analogously, in the case of an object to be examined through which radiation can be passed, an SEM can also be operated as an STEM.

By way of example, it is possible to use the TEM to determine the structure of a crystal in more detail. For this purpose, in particular, the images or diffraction patterns produced using the electrons passing through the object are evaluated. In principle, a diffraction pattern is a Fourier transform of the object to be examined and has structures whose position in the diffraction pattern is governed by the distances and spatial frequencies of the lattice structure of the crystal. It is also possible to use the intensity of the structures to make deductions about the content of an elementary cell of a crystal. The abovementioned diffraction pattern can be obtained without a scanning mode, or in the scanning mode of the TEM.

In the prior art, a standard raster process is carried out for the scanning mode of a particle beam device. In this standard raster process, a raster pattern is predetermined having a multiplicity of raster lines which are arranged parallel to one another, with each of the multiplicity of raster lines comprising an identical number of raster points (pixels). The primary electron beam in the standard raster process is guided to a first end of a first raster line. The primary electron beam is then guided, starting from the first end of the first raster line, in the direction of a second end of the first raster line from one raster point to another, until the second end of the first raster line is reached. The primary electron beam is then guided to the first end of a second raster line. An identical process is carried out with the second raster line to that with the first raster line. During the process, the time for which the primary electron beam remains at each raster point is identical, and can be predetermined in a fixed form by a control system for a specific imaging mode.

By way of example, the imaging mode defines a chosen magnification and the speed at which the primary electron beam is scanned over the object. During the abovementioned guidance of the primary electron beam from the second end of the first raster line to the first end of the second raster line, it is known from the prior art for a further dwell duration to be provided. This further dwell duration is predetermined in a fixed form, for example by the control system, as a function of a chosen imaging mode. A fixed flyback time is predetermined as a function of the chosen imaging mode, with this being the time which is intended to exist between reaching and dwelling at the second end of the first raster line on the one hand and the guidance of the primary electron beam to the first end of the second raster line, on the other hand. A further known embodiment provides for the primary electron beam to be guided from the second end of the first raster line to the first end of the second raster line, where the primary electron beam remains during the further dwell duration, until the primary electron beam passes over the second raster line, following a trigger signal. By way of example, this trigger signal is coupled to the power supply system frequency.

The guidance of the primary electron beam from one raster point to a next raster point is also referred to as raster guidance or else rastering.

In a high-resolution mode, an STEM can be used to make atomic structures visible, and to image them. Furthermore, it is also possible to image a spatially periodic crystal structure of crystalline samples. During the evaluation of images such as these, the Fourier transform is used to represent the spatial frequencies present in a respective image. The intensity of a point in a Fourier-transformed image (also referred to in the following text as an FFT image) of the respective image indicates the amplitude with which a specific spatial frequency (periodicity based on frequency and direction) is present in the respective image.

However, it has been found that disturbances which influence the image of very small structures (for example atomic structures of a crystalline object) lead to artifacts in the respective image. Even minor periodic disturbances (for example fluctuations in the position of the primary electron beam, fluctuations in the intensity of the primary electron beam and/or fluctuations in the intensity of a detection signal) can lead to undesirable artifacts being visible both in the respective image and in the corresponding FFT image. The artifacts make it harder to evaluate the FFT image.

Accordingly, it would be desirable to provide a method and a particle beam device for producing a representation of an object, in which images which are produced, in particular also FFT images, are as free as possible of artifacts which are not caused by the object to be examined.

SUMMARY OF THE INVENTION

According to the system described herein, a method is used to produce a representation of an object using a particle beam, wherein the particle beam is made available by a particle beam device having at least one particle beam column. The particle beam column has a beam generator for producing a particle beam, and an objective lens for focusing the particle beam onto the object. In the method according to the system described herein, a raster area is defined on the object. This is the area over which the particle beam is guided in order to obtain a representation of the object. The raster area provided here has a multiplicity of raster lines, wherein the multiplicity is provided with at least one first raster line and at least one second raster line, wherein the first raster line has a multiplicity of raster points, wherein the multiplicity of raster points have at least one first raster point and at least one second raster point, and wherein the second raster line has a multiplicity of further raster points, wherein this multiplicity are provided with at least one third raster point and at least one fourth raster point. In this case, in the text above and that below, a raster line may be, for example, an arrangement of raster points along a straight line. However, the system described herein is not restricted to an arrangement of raster points along a straight line. In fact, the raster points may be arranged along a line which has a different shape, for example a circular or spiral shape.

Furthermore, in the method according to the system described herein, a raster pattern is defined, wherein the raster pattern defines guidance of the particle beam through the raster area. For example, the particle beam is passed sequentially through the individual raster points in the first raster line and in the second raster line. However, the system described herein is not restricted to this raster pattern. In fact, any raster pattern which is suitable for the system described herein can be used, for example spiral guidance of the particle beam through the raster area or even individual raster points in the first raster line and in the second raster line being passed through on the random-number principle.

Furthermore, the method according to the system described herein provides for the particle beam to be produced and for the particle beam to be passed to one of the following raster points: the first raster point, the second raster point, the third raster point or the fourth raster point. Furthermore, it is envisaged that the particle beam be guided in accordance with the raster pattern over the raster area, wherein the particle beam remains at the first raster point for a first time period, at the second raster point for a second time period, at the third raster point for a third time period, and/or at the fourth raster point for a fourth time period. The first time period to the fourth time period are the time periods in which it is possible to use a detection device to detect interaction particles and/or interaction radiation, which are or is created by an interaction of the particle beam with the object, and, for example, to integrate the signals detected using the detection device and associated with one of the first to fourth raster points. The first time period to the fourth time period are also respectively referred to as the pixel life or raster point life.

Furthermore, in the method according to the system described herein, there is a fifth time period between guidance of the particle beam over the first raster line and guidance of the particle beam over the second raster line. The multiplicity of raster lines also result in a multiplicity of fifth time periods. The fifth time period is also referred to as the line flyback time.

Furthermore, there is a sixth time period during guidance of the particle beam between scanning of one of the following raster points, specifically the first raster point, the second raster point, the third raster point and the fourth raster point, using the particle beam and scanning of a further and different one of the following raster points, specifically the first raster point, the second raster point, the third raster point as well as the fourth raster point. In other words, there is a sixth time period between the scanning of one of the abovementioned raster points (for example the first raster point) and the scanning of a further, but different, one of the abovementioned raster points (for example the second raster point). The multiplicity of raster points also result in a multiplicity of sixth time periods. The sixth time period is also referred to as the pixel pause time.

The method according to the system described herein also provides for detection of, interaction particles and/or interaction radiation.

The method according to the system described herein furthermore provides for variation of at least one of the following time periods: the first time period, the second time period, the third time period, the fourth time period, the fifth time period and the sixth time period.

The system described herein is based, at least in part, on the following idea. The standard raster method explained above is in principle a linear image (that is to say a correlation) between a time profile of a signal detected in a particle beam device and the respective position associated with the detected signal on the object. For this reason, fluctuations which are periodic over time (for example fluctuations in the position of the primary electron beam and/or fluctuations in the intensity of the primary electron beam) in a representation of the object produced using detected signals appear as spatially periodic fluctuations in the form of disturbing patterns (artifacts). These disturbing patterns can be seen particularly well in an FFT image. Deliberations have now revealed that better representations of the object can be achieved by canceling out the correlation between the time profile of the detected signal (which has the fluctuations that are periodic over time) and the respective position associated with the detected signal on the object, in which better representations the disturbing artifacts are now only very restricted or are even no longer perceptible at all. This is achieved by varying at least one of the abovementioned time periods. The above-mentioned correlation is canceled in this way. The more completely the cancellation is implemented, the more uniformly will any disturbing patterns that occur be distributed in the representation, as a result of which they are less pronounced in the representation.

In a first exemplary embodiment of the method according to the system described herein, provision is additionally or alternatively made for at least one of the following time periods, specifically the first time period, the second time period, the third time period, the fourth time period, the fifth time period and the sixth time period, to be randomly varied deterministically or non-deterministically. In yet another exemplary embodiment of the method according to the system described herein, provision is made for the method to have at least one of the following features:

the first time period, the second time period, the third time period and the fourth time period form a first sequence for the raster area, wherein the first sequence is subdivided into at least one first area of the first sequence and at least one second area of the first sequence, wherein at least the time periods which are included in the first area of the first sequence are randomly varied deterministically or non-deterministically, the multiplicity of fifth time periods form a second sequence for the raster area, wherein the second sequence is subdivided into at least one first area of the second sequence and at least one second area of the second sequence, wherein at least the fifth time periods which are included in the first area of the second sequence are randomly varied deterministically or non-deterministically, and the multiplicity of sixth time periods form a third sequence for the raster area, wherein the third sequence is subdivided into at least one first area of the third sequence and at least one second area of the third sequence, wherein at least the sixth time periods which are included in the first area of the third sequence are randomly varied deterministically or non-deterministically.

A further embodiment of the method according to the system described herein alternatively or additionally provides that the raster pattern is defined such that the particle beam is first of all passed over the first raster line and then over the second raster line in the raster area. By way of example, the first raster point and the second raster point in the first raster line are scanned sequentially. The third raster point and the fourth raster point in the second raster line are then scanned sequentially, for example. Furthermore, provision is additionally or alternatively made that the raster pattern is defined such that the particle beam is guided through the raster area in the following sequence: first of all to the first raster point in the first raster line, then to the second raster point in the first raster line, then to the fourth raster point in the second raster line, and then to the third raster point in the second raster line. A further embodiment of the method according to the system described herein alternatively or additionally provides that the raster pattern is defined such that it has a rectangular and/or spiral shape. As has already been mentioned further above however, the system described herein is not restricted to a specific raster pattern. In fact, any raster pattern which is suitable for the system described herein can be used, for example even with individual raster points in the first raster line and in the second raster line being passed through on the basis of the random-number principle.

In principle, the abovementioned fifth time period is nothing more than a pause between the guidance of the particle beam over the first raster line and the guidance of the particle beam over the second raster line. One embodiment of the method according to the system described herein additionally or alternatively provides for the fifth time period to be varied using a first random-number generator. As an alternative to this, the system described herein provides for the fifth time period to be varied such that the fifth time period is up to 5%, up to 10%, up to 20%, up to 30%, up to 40%, up to 50% or up to 70% shorter than the sum of the first time period and the second time period, and/or the sum of the third time period and the fourth time period. By way of example, the abovementioned variations are defined using the first random-number generator. In particular, the system described herein provides for the first random-number generator to be in the form of a deterministic random-number generator. Furthermore, this embodiment additionally or alternatively provides for the fifth time period always to be redefined, for two successive raster lines, for example in a raster area with more than two raster lines.

In yet another embodiment of the method according to the system described herein, additionally or alternatively to this, the sixth time period is varied using a second random-number generator. Once again, as an alternative to this, the sixth time period is varied such that the sixth time period is up to 10%, up to 20%, up to 30%, up to 40%, up to 50%, up to 60%, up to 70%, up to 80% or up to 90% shorter than the first time period, the second time period, the third time period and/or the fourth time period. As an alternative to this, the system described herein provides that the sixth time period is varied such that the sixth time period corresponds to the first time period, to the second time period, to the third time period and/or to the fourth time period.

In yet another embodiment of the method according to the system described herein, the system described herein provides that the method additionally or alternatively has at least one of the following features:

the first time period, the second time period, the third time period and/or the fourth time period are/is varied such that the first time period is different to the second time period, to the third time period and to the fourth time period, the first time period, the second time period, the third time period and/or the fourth time period are/is varied such that the second time period is different to the first time period, to the third time period and to the fourth time period, the first time period, the second time period, the third time period and/or the fourth time period are/is varied such that the third time period is different to the first time period, to the second time period and to the fourth time period, or the first time period, the second time period, the third time period and/or the fourth time period are/is varied such that the fourth time period is different to the first time period, to the second time period and to the third time period.

The system described herein also relates to a further method for producing a representation of an object using a particle beam. By way of example, this further method can be provided with one of the abovementioned features or with a combination of the abovementioned features. The particle beam is made available by a particle beam device having at least one particle beam column, wherein the particle beam column has a beam generator for producing a particle beam, and has an objective lens for focusing the particle beam onto the object. The further method provides that at least one raster area is defined on the object, wherein the raster area has at least one first raster point, at least one second raster point and at least one third raster point. Furthermore, a raster pattern is defined wherein the raster pattern defines guidance of the particle beam through the raster area. The further method also comprises generating the particle beam and the particle beam being passed to a start point which is defined by one of the following raster points: the first raster point, the second raster point or the third raster point. The particle beam is guided from the start point in accordance with the raster pattern over the raster area wherein the particle beam is guided to the first raster point at a first time, to the second raster point at a second time, and to the third raster point at a third time. The interaction particles and/or interaction radiation are/is detected at the abovementioned times, wherein the interaction particles and/or the interaction radiation are/is created by interaction of the particle beam with the object. The first time, the second time and the third time are chosen such that a first time interval, which is defined by a first difference between the first time and the second time, and a second time interval, which is defined by a second difference between the first time and the third time, are different.

The further method is based, at least in part, on the following idea. In a raster pattern, the particle beam passes through a predetermined number of raster points. As a result of the movements which are predetermined by the raster pattern, there are different time intervals between one raster point and its adjacent raster points, wherein a time interval is defined by the difference between the respective times at which two adjacent raster points are in each case scanned. The different time intervals are likewise not correlated, as a result of which, even in the case of a representation which is produced using this method, disturbing artifacts in an FFT image are now perceptible only to a very restricted extent, or even not at all.

One exemplary embodiment of the further method additionally or alternatively provides that the particle beam remains at the first raster point for a first time period, at the second raster point for a second time period and at the third raster point for a third time period. Furthermore, the further method has one of the following features:

the first time period, the second time period and the third time period are identical to one another, or at least one of the following time periods, specifically the first time period, the second time period and the third time period, are different to one of the further ones of the following time periods, specifically the first time period, the second time period and the third time period.

Yet another exemplary embodiment of the further method additionally or alternatively provides that the definition of a raster pattern comprises the definition of a spiral and/or rectangular raster pattern.

One exemplary embodiment of each method as described above additionally or alternatively provides that the particle beam is guided over the raster area at least a first time in order to produce a first representation, and is guided over the raster area at least a second time in order to produce a second representation. The first representation and the second representation are then combined using an averaging method or integration method to form a final representation. Further embodiments provide for the particle beam to be guided over the raster area more than twice, and for each of the representations produced in this way to be combined with one another. It is also additionally or alternatively possible to provide for the first representation and the second representation to be produced using different raster parameters (for example different pixel lives). This results in particularly good low-noise representations of the object.

The system described herein also relates to a computer program product having a program code which can be run and which, when run in a processor (for example a computer processor), carries out the steps of a method which has at least one of the abovementioned features or a combination of at least two of the abovementioned features.

Furthermore, the system described herein relates to a particle beam device, for example to an electron beam device in the form of a TEM or an SEM. The particle beam device according to the system described herein has at least one first particle beam column, wherein the first particle beam column is provided with a first beam generator for generating a first particle beam, and with a first objective lens for focusing the first particle beam onto an object. Furthermore, the particle beam device according to the system described herein has at least one first raster device for guiding the first particle beam over the object, at least one first detection unit for detection of interaction particles and/or interaction radiation, and at least one monitoring unit with a processor in which an abovementioned computer program product is loaded.

Furthermore, the system described herein relates to a further particle beam device, for example to an electron beam device in the form of a TEM or an SEM. The further particle beam device according to the system described herein is provided with at least one first particle beam column, wherein the first particle beam column has a first beam generator for generating a first particle beam, and a first objective lens for focusing the first particle beam onto an object. Furthermore, the further particle beam device has at least one first control unit for defining a first raster area on the object, and for defining a first raster pattern. The first raster area is provided with a multiplicity of raster lines, with the multiplicity have at least one first raster line and at least one second raster line. The first raster line in turn has a multiplicity of raster points, wherein the multiplicity of raster points have at least one first raster point and at least one second raster point. Furthermore, the second raster line has a multiplicity of further raster points, wherein the multiplicity of further raster points have at least one third raster point and at least one fourth raster point. The first raster pattern defines guidance of the first particle beam through the first raster area. Furthermore, at least one first raster device is provided on the further particle beam device in order to guide the first particle beam over the object, wherein the first particle beam remains at the first raster point for a first time period, at the second raster point for a second time period, at the third raster point for a third time period and/or at the fourth raster point for a fourth time period, wherein there is a fifth time period between guidance of the first particle beam over the first raster line and guidance of the first particle beam over the second raster line, wherein the multiplicity of raster lines define a multiplicity of fifth time periods, and wherein there is a sixth time period during guidance of the particle beam between scanning of at least one of the following raster points, specifically the first raster point, the second raster point, the third raster point and the fourth raster point, using the first particle beam and scanning of a further and different one of the following raster points, specifically the first raster point, the second raster point, the third raster point and the fourth raster point, wherein the multiplicity of raster points define a multiplicity of sixth time periods. Furthermore, the further particle beam device is provided with at least one first detection unit for detection of interaction particles and/or interaction radiation.

Furthermore, at least one second control unit is provided in the further particle beam device in order to vary at least one of the following time periods: the first time period, the second time period, the third time period, the fourth time period, the fifth time period and the sixth time period.

Additionally or alternatively, the second control unit is designed such that at least one of the following time periods, specifically the first time period, the second time period, the third time period, the fourth time period, the fifth time period and the sixth time period, is randomly varied deterministically or non-deterministically. Furthermore, additionally or alternatively, the second control unit is designed such that at least one of the following features is provided:

- the first time period, the second time period, the third time period and the fourth time period form a first sequence for the raster area, wherein the first sequence is subdivided into at least one first area of the first sequence and at least one second area of the first sequence, wherein at least the time periods which are included in the first area of the first sequence are randomly varied deterministically or non-deterministically,
- the multiplicity of fifth time periods form a second sequence for the raster area, wherein the second sequence is subdivided into at least one first area of the second sequence and at least one second area of the second sequence, wherein at least the fifth time periods which are included in the first area of the second sequence are randomly varied deterministically or non-deterministically, and
- the multiplicity of sixth time periods form a third sequence for the raster area, wherein the third sequence is subdivided into at least one first area of the third sequence and at least one second area of the third sequence, wherein at least the sixth time periods which are included in the first area of the third sequence are randomly varied deterministically or non-deterministically.

Additionally or alternatively, a further particle beam device is given by the following features. The further particle beam device has at least one first particle beam column, wherein the first particle beam column has a first beam generator for generating a first particle beam, and a first objective lens for focusing the first particle beam onto an object. Furthermore, at least one first control unit is provided in order to define a first raster area on the object and in order to define a first raster pattern, wherein the first raster area has at least one first raster point, at least one, second raster point and at least one third raster point, and wherein the first raster pattern defines guidance of the first particle beam through the first raster area. Furthermore, at least one first raster device is provided for guiding the first particle beam over the object in accordance with the first raster pattern, wherein the first raster device is designed such that the particle beam is guided to the first raster point at a first time, to the second raster point at a second time and to the third raster point at a third time. In addition, the particle beam device has at least one first detection unit for detection of interaction particles and/or interaction radiation. The first control unit is designed such that the first time, the second time and the third time are chosen such that a first time interval, which is defined by a first difference between the first time and the second time, and a second time interval, which is defined by a second difference between the first time and the third time, are different.

Additionally or alternatively, in a further exemplary embodiment of one of the abovementioned particle beam devices, the particle beam device has at least one second particle beam column. The second particle beam column is provided with a second beam generator for generating a second particle beam, and with a second objective lens for focusing the second particle beam onto the object. The particle beam device has at least one third control unit for defining a second raster area on the object, and for defining a second raster pattern. Furthermore, the second particle beam column is provided with at least one second raster device for guiding the second particle beam over the object in accordance with the second raster pattern. In addition, the particle beam device has, for example, at least one second detection unit for detection of interaction particles and/or interaction radiation.

Additionally or alternatively, in yet another embodiment of the abovementioned particle beam device, the third control unit is designed such that the second raster area is defined by a multiplicity of raster lines, wherein the second raster area is provided with at least one third raster line and at least one fourth raster line, wherein the third raster line has a multiplicity of raster points, wherein the multiplicity of raster points have at least one fifth raster point and at least one sixth raster point, wherein the fourth raster line is provided with a multiplicity of further raster points, wherein the multiplicity of further raster points have at least one seventh raster point and at least one eighth raster point, and wherein the second particle beam remains at the fifth raster point for a seventh time period, at the sixth raster point for an eighth time period, at the seventh raster point for a ninth time period and/or at the eighth raster point for a tenth time period, wherein there is an eleventh time period between guidance of the second particle beam over the third raster line and guidance of the second particle beam over the fourth raster line, wherein the multiplicity of raster lines define a multiplicity of eleventh time periods, and wherein there is a twelfth time period during guidance of the second particle beam between scanning of at least one of the following raster points, specifically the fifth raster point, the sixth raster point, the seventh raster point and the eighth raster point, using the second particle beam, and scanning of a further and different one of the following raster points, specifically the fifth raster point, the sixth raster point, the seventh raster point and the eighth raster point, using the second particle beam, wherein the multiplicity of raster points define a multiplicity of twelfth time periods. Furthermore, the particle beam device has at least one fourth control unit for varying at least one of the following time periods, specifically the seventh time period, the eighth time period, the ninth time period, the tenth time period, the eleventh time period and the twelfth time period. By way of example, the variation can be carried out as described above.

Additionally or alternatively, a further exemplary embodiment of one of the abovementioned particle beam devices provides that the third control unit is designed such that the second raster area is defined by at least one fifth raster point, at least one sixth raster point and at least one seventh raster point, and such that the second raster pattern is defined to have a rectangular and/or spiral shape.

Additionally or alternatively, yet another exemplary embodiment of one of the abovementioned particle beam devices provides that the particle beam device has one of the following features:

- the first particle beam column is in the form of an electron beam column, and the second particle beam column is in the form of an ion beam column,
- the first particle beam column is in the form of an ion beam column, and the second particle beam column is in the form of an electron beam column, or
- the first particle beam column is in the form of an ion beam column, and the second particle beam column is in the form of an ion beam column.

BRIEF DESCRIPTION OF THE DRAWINGS

Embodiments of the system described herein will be explained in more detail in the following text with reference to the figures, in which.

DETAILED DESCRIPTION OF VARIOUS EMBODIMENTS

The system described herein will be further explained in the following text in particular with reference to a particle beam device 1 in the form of a TEM. However, it should be noted at this stage that the system described herein is not restricted to a TEM, and in fact the system described herein can be used for any particle beam device.

Figure 1:
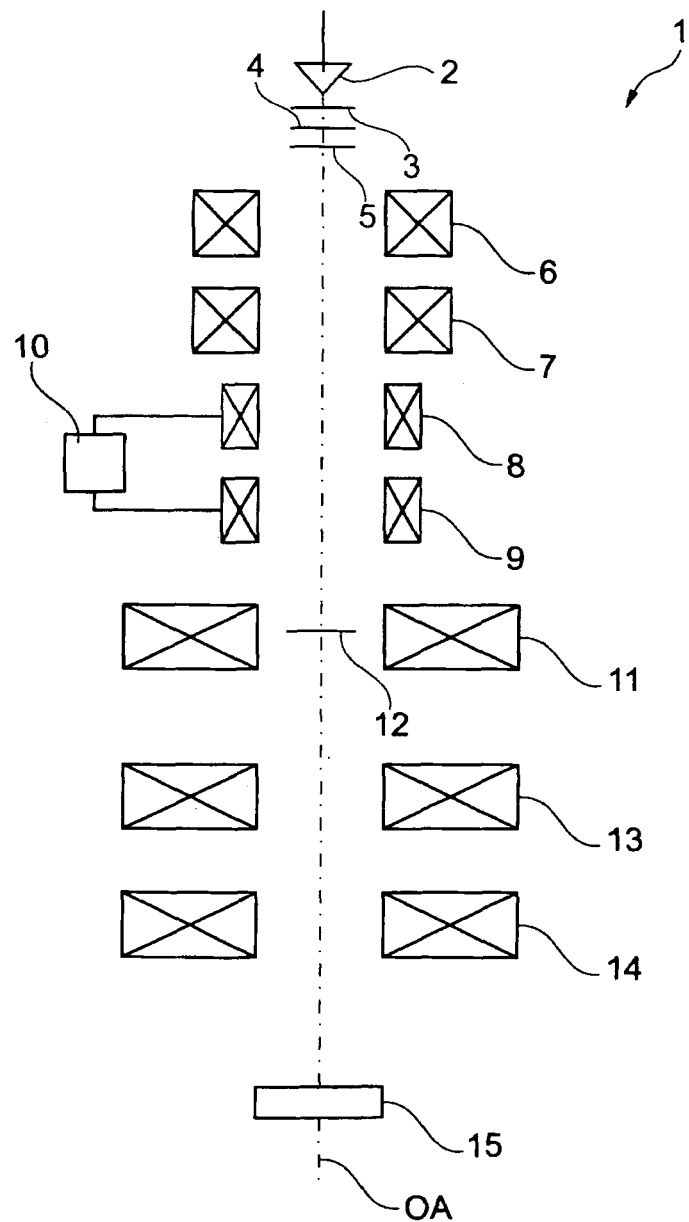
FIG. 1 shows a schematic illustration of a particle beam device in the form of a TEM that may be used in connection with an embodiment of the system described herein.

FIG. 1 shows a schematic illustration of a particle beam device 1. The particle beam device 1 has an electron source 2 in the form of a thermal field emission source. However, a different particle beam source can invariably also be used. An extraction electrode 3 is arranged behind the electron source 2 along the optical axis OA of the particle beam device 1, and the potential on this extraction electrode 3 extracts electrons from the electron source 2. Furthermore, a first electrode 4 is provided for focusing the source position, as well as at least one second electrode 5 in the form of an anode for accelerating the electrons. Due to the second electrode 5, the electrons emerging from the electron source 2 are accelerated to a desired and adjustable energy, using an electrode voltage. The electrons form a particle beam in the form of an electron beam.

A two-stage condenser is arranged further on the optical axis OA, has a first magnetic lens 6 and a second magnetic lens 7, and a first raster device 8 and a second raster device 9 are connected following the condenser. Both the first raster device 8 and the second raster device 9 are connected to a first control unit 10. The control unit 10 is provided with a control processor which produces control signals. The first raster device 8 and the second raster device 9 can be used to scan the particle beam over an object which is arranged on an object plane 12. Furthermore, the particle beam device 1 has an objective 11, which is in the form of a magnetic lens. The object plane 12 is arranged at the objective 11, and the object to be examined is arranged on the object plane 12 using a sample manipulator.

In the opposite direction to the electron source 2, the objective 11 is followed by a projection lens system having a first lens 13 and a second lens 14. The first lens 13 and the second lens 14 then produce a representation on a detector 15 of the object which is arranged on the object plane 12. The representation is, for example, an image or a diffraction pattern of the object.

Figure 2:
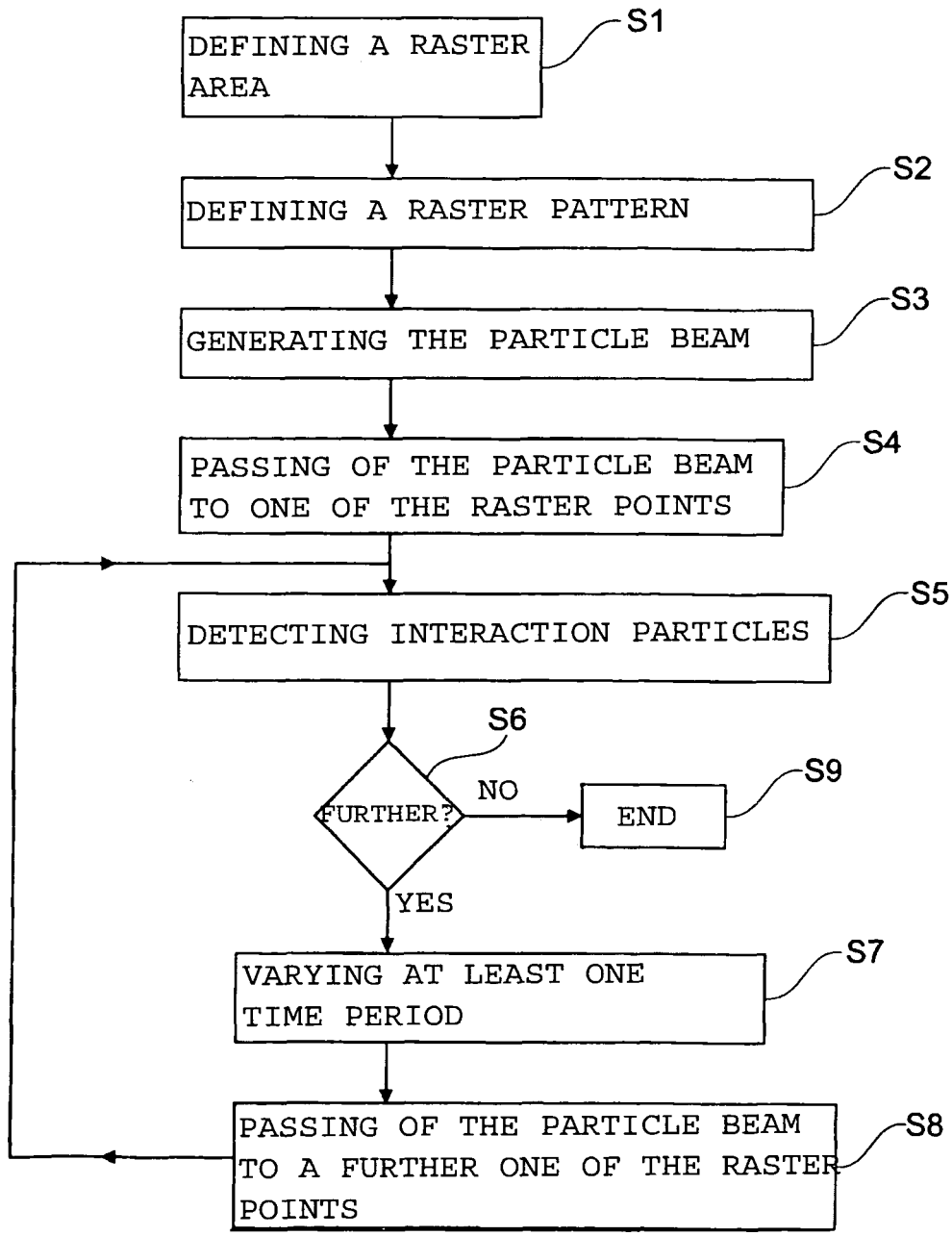
FIG. 2 shows a simplified flowchart of a method for producing a representation of an object according to an embodiment of the system described herein.

FIG. 2 shows a schematic illustration of a simplified procedure for one exemplary embodiment of the method according to the system described herein. First of all, a raster area on the object arranged on the object plane 12 is defined in a method step S1. This is illustrated in more detail in FIG. 3. A raster area 17 which is intended to be examined in more detail using the particle beam is defined on the object 16. The raster area 17 has a first raster line 18A, a second raster line 18B, a third raster line 18C and a fourth raster line 18D. FIG. 4 shows the arrangement of the first raster line 18A, of the second raster line 18B, of the third raster line 18C and of the fourth raster line 18D, illustrated enlarged. Each of the abovementioned raster lines 18A to 18D has raster points. The first raster line 18A has a first raster point 19, a second raster point 20, a third raster point 21, a fourth raster point 22, a fifth raster point 23, a sixth raster point 24, a seventh raster point 25 and an eighth raster point 26. Furthermore, the second raster line 18B is provided with a ninth raster point 27, a tenth raster point 28, an eleventh raster point 29, a twelfth raster point 30, a thirteenth raster point 31, a fourteenth raster point 32, a fifteenth raster point 33 and a sixteenth raster point 34. The third raster line 18C in turn has a seventeenth raster point 35, an eighteenth raster point 36, a nineteenth raster point 37, a twentieth raster point 38, a twenty first raster point 39, a twenty second raster point 40, a twenty third raster point 41 and a twenty fourth raster point 42. Finally, the fourth raster line 18D is provided with a twenty fifth raster point 43, a twenty sixth raster point 44, a twenty seventh raster point 45, a twenty eighth raster point 46, a twenty ninth raster point 47, a thirtieth raster point 48, a thirty first raster point 49 and a thirty second raster point 50.

Figure 3:
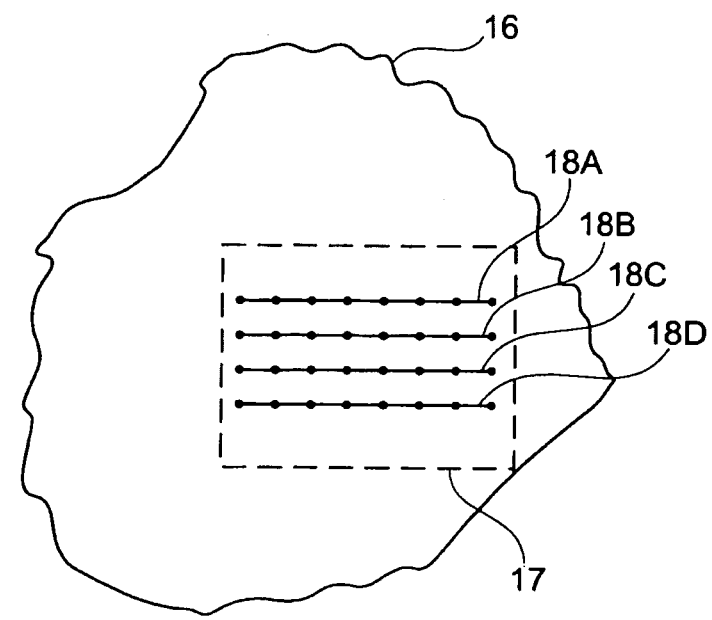
FIG. 3 shows a schematic representation of an object with a raster area according to an embodiment of the system described herein.
Figure 4:
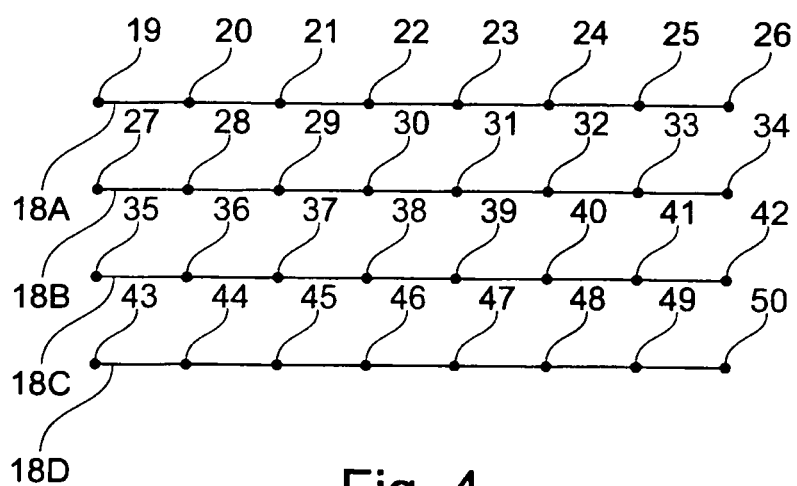
FIG. 4 shows a schematic illustration of the raster area with raster lines as shown in FIG. 3.
Figure 5A:
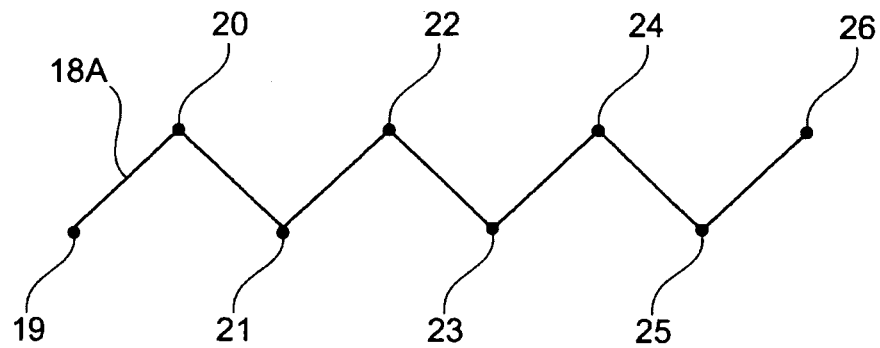
FIG. 5A shows a schematic illustration of a further exemplary embodiment of a raster line according to an embodiment of the system described herein.
Figure 5B:
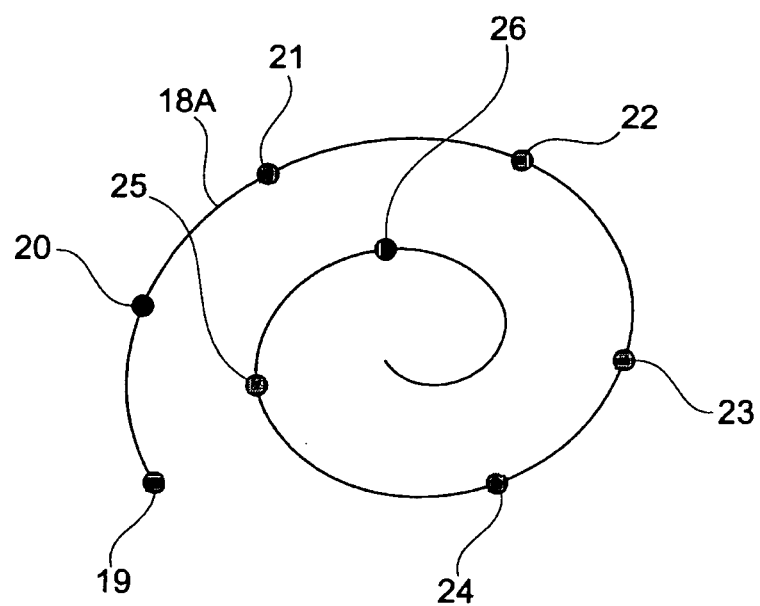
FIG. 5B shows a schematic illustration of yet another exemplary embodiment of a raster line according to an embodiment of the system described herein.

The abovementioned raster lines 18A to 18D as well as the abovementioned raster points 19 to 50 are arranged in the form of a grid in the exemplary embodiment illustrated in FIGS. 3 and 4. It should explicitly be noted that the system described herein is not restricted to a raster area such as this. In fact, individual or all of the abovementioned raster lines may be configured differently. By way of example, FIG. 5A shows the first raster line 18A in the form of a sawtooth. By way of example, FIG. 5B shows the first raster line 18A in the form of a spiral.

Figure 6A:
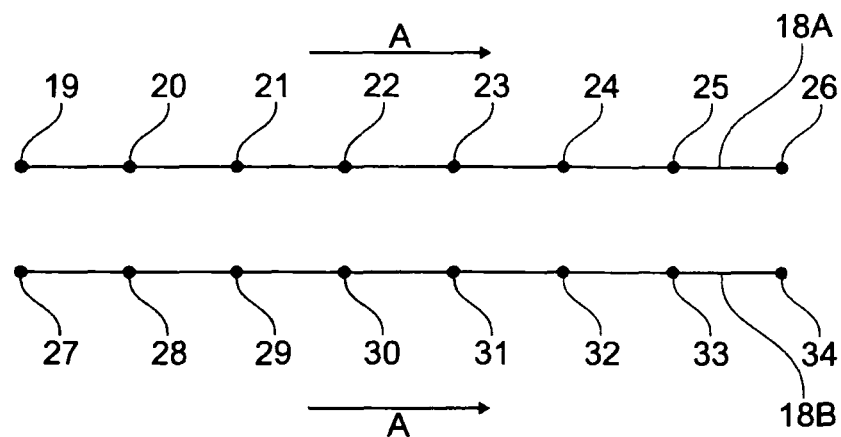
FIG. 6A shows a schematic illustration of a first raster pattern according to an embodiment of the system described herein.
Figure 6B:
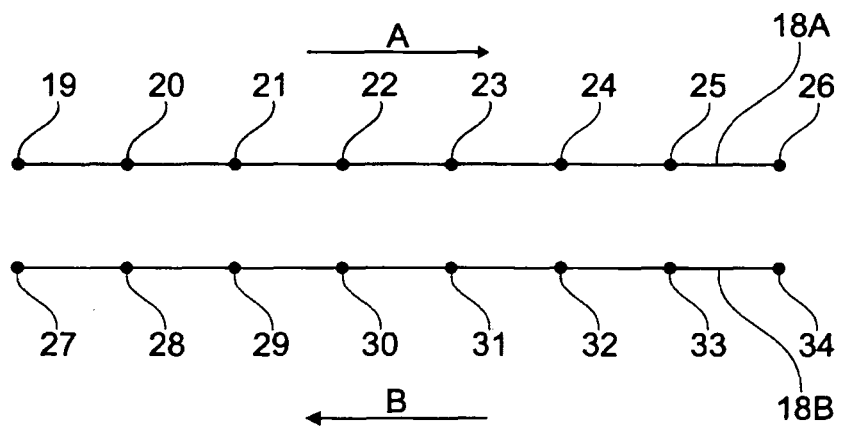
FIG. 6B shows a schematic illustration of a second raster pattern according to an embodiment of the system described herein.
Figure 6C:
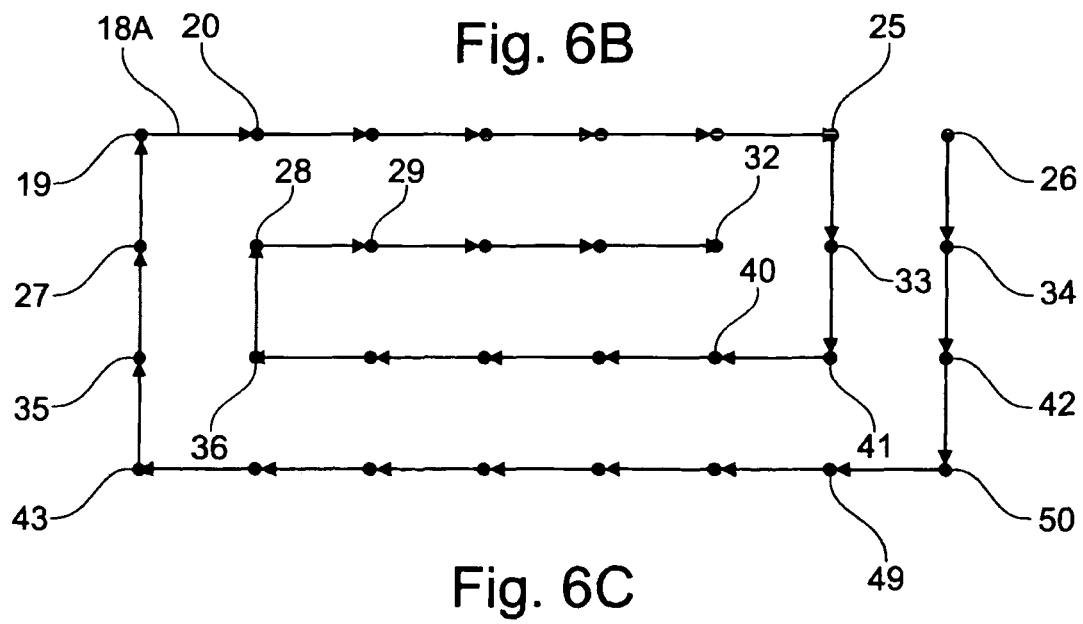
FIG. 6C shows a schematic illustration of a third raster pattern according to an embodiment of the system described herein.

A raster pattern is now defined in a further method step S2, as shown in FIG. 2. The raster pattern defines the guidance (position movement) of the particle beam when the particle beam is scanned over the raster area 17 as shown in FIG. 3. FIGS. 6A to 6C show exemplary embodiments of raster patterns.

For example, FIG. 6A shows a first raster pattern. For clarity reasons, only the first raster line 18A and the second raster line 18B are shown. The first raster pattern includes unidirectional guidance of the particle beam over each of the abovementioned raster lines 18A to 18D in one direction. Thus, in the first raster pattern, the particle beam is first of all guided to the first raster point 19 on the first raster line 18A. The particle beam is then guided in the direction of the arrow A along the first raster line 18A such that the abovementioned raster points 20 to 26 in the first raster line 18A are scanned successively. After the eighth raster point 26 on the first raster line 18A has been scanned, the particle beam is guided to the ninth raster point 27 in the second raster line 18B. The particle beam is then guided along the second raster line 18B in the direction of the arrow A, such that the abovementioned raster points 27 to 34 in the second raster line 18B are scanned successively.

FIG. 6B shows a second raster pattern. Once again, for clarity reasons, only the first raster line 18A and the second raster line 18B are illustrated. The second raster pattern includes bidirectional guidance of the particle beam over each of the abovementioned raster lines 18A to 18D. In the second raster pattern, the particle beam is therefore first of all guided to the first raster point 19 in the first raster line 18A. The particle beam is then guided over the first raster line 18A in the direction of the arrow A such that the abovementioned raster points 20 to 26 in the first raster line 18A are scanned. After scanning the eighth raster point 26 in the first raster line 18A, the particle beam is guided to the sixteenth raster point 34 in the second raster line 18B. The particle beam is then guided over the second raster line 18B in the direction of the arrow B, such that the abovementioned raster points 33 to 27 in the second raster line 18B are scanned successively.

FIG. 6C shows a third raster pattern with raster points. For clarity reasons, only some of the abovementioned raster points are provided with reference symbols. The third raster pattern includes a spiral scan of the raster area 17. The guidance of the particle beam over the raster area 17 is indicated by arrows. In the third raster pattern, the particle beam is therefore guided first of all to the eighth raster point 26. The particle beam is then guided to the sixteenth raster point 34, then to the twenty fourth raster point 42 and finally to the thirty second raster point 50. From there, the particle beam is guided such that the abovementioned raster points 49 to 43 are scanned. The particle beam is then first of all guided to the seventeenth raster point 35, then to the ninth raster point 27 and then to the first raster point 19. From there, the particle beam is guided such that the abovementioned raster points 20 to 25 are scanned. The particle beam is then first of all guided to the fifteenth raster point 33, and then to the twenty third raster point 41. The particle beam is then guided such that the abovementioned raster points 40 to 36 are scanned. From there, the particle beam is guided to the tenth raster point 28. The particle beam is then guided such that the abovementioned raster points 29 to 32 are scanned.

At this point, it is explicitly noted that the system described herein is not restricted to the abovementioned raster patterns. In fact, any desired raster pattern can be used which is suitable for the system described herein. In particular, further exemplary embodiments provide for the raster pattern to be generated by a random-number generator. In this case, any desired ones of the abovementioned raster points 19 to 50 can be scanned successively independently of the association with one of the abovementioned raster lines 18A to 18D, for example with each of the abovementioned raster points 19 to 50 each being scanned only once.

In a further method step S3 as shown in FIG. 2, the particle beam is generated once the raster pattern has been defined (for example the first raster pattern, the second raster pattern or the third raster pattern). The particle beam is then moved in a method step S4 to one of the raster points, which corresponds to the start point of the raster pattern. By way of example, in the first raster pattern and the second raster pattern, this is the first raster point 19 in the first raster line 18A. By way of example, this is the eighth raster point 26 in the third exemplary embodiment. The particle beam is then guided over the raster area 17 in accordance with the defined raster pattern.

Interaction particles are now detected using the detector 15 in yet another method step S5. Furthermore, the method is continued after a check in method step S6.

At least one time period is now varied in a method step S7 as shown in FIG. 2. This will now be explained in more detail in the following text.

One variable which can also define the method according to the system described herein is the dwell duration of the particle beam in one of the abovementioned raster lines 18A to 18D. A first raster line time period is the dwell duration in which the particle beam remains in the first raster line 18A. A second raster line time period is the dwell duration in which the particle beam remains in the second raster line 18B. The particle beam remains in the third raster line 18C for a third raster line time period. The particle beam remains in the fourth raster line 18D for a fourth raster line time period. In one exemplary embodiment, the first raster line time period, the second raster line time period, the third raster line time period and/or the fourth raster line time period are/is varied such that each of the abovementioned raster line time periods is different to at least one or more of the further abovementioned raster line time periods. In yet another embodiment, at least one of the abovementioned raster line time periods is varied with respect to at least one further of the abovementioned raster line time periods such that the at least one of the abovementioned raster line time periods is up to 5%, up to 10%, up to 15%, up to 20%, up to 25%, up to 30%, up to 35%, up to 40%, up to 45%, or up to 50% shorter than the at least one further of the abovementioned raster line time periods. In a further embodiment, at least one or more (for example all) of the abovementioned raster line time periods is or are chosen randomly using a random-number generator, which is contained in the control unit 10 shown in FIG. 1.

A further variable which can additionally or alternatively also define the method according to the system described herein is the time period between a complete scan of (that is to say the complete pass over) one of the abovementioned raster lines 18A to 18D and a further one of the abovementioned raster lines 18A to 18D. In principle, this is a pause between the complete scan of (that is to say the complete pass over) one of the abovementioned raster lines 18A to 18D and a further one of the abovementioned raster lines 18A to 18D. This time period is therefore also referred to in the following text as the line pause time period. In one embodiment, the line pause time period can be defined using the random-number generator in the control unit 10 as shown in FIG. 1. In yet another embodiment, the line pause time period can be varied to be up to 5%, up to 10%, up to 15%, up to 20%, up to 25%, up to 30%, up to 35%, up to 40%, up to 50% or up to 70% shorter than at least one of the abovementioned raster line time periods. Furthermore, in a further embodiment, the line pause time period between two of the abovementioned raster lines 18A to 18D can be chosen such that it is always different. For example, a first line pause time period between guidance of the particle beam over the first raster line 18A and guidance of the particle beam over the second raster line 18B is different to a second line pause time period between the guidance of the particle beam over the second raster line 18B and the guidance of the particle beam over the third raster line 18C.

Additionally or alternatively, in yet another exemplary embodiment, the dwell duration of the particle beam on at least one or more (possibly even all) of the abovementioned raster points 19 to 50 can be varied. The dwell duration is referred to in the following text as the raster point time period.

This exemplary embodiment will be explained using the abovementioned raster points 19 to 26 in the first raster line 18A. It is noted at this point that the following statements also apply, of course, to all the other abovementioned raster points 27 to 50.

The particle beam remains at the first raster point 19 for a first raster point time period, at the second raster point 20 for a second raster point time period, at the third raster point 21 for a third raster point time period, at the fourth raster point 22 for a fourth raster point time period, at the fifth raster point 23 for a fifth raster point time period, at the sixth raster point 24 for a sixth raster point time period, at the seventh raster point 25 for a seventh raster point time period, and at the eighth raster point 26 for an eighth raster point time period. The first raster point time period to the eighth raster point time period are each varied such that at least one of the first raster point time period to the eighth raster point time period is different to at least one or more of the further ones of the first raster point time period to the eighth raster point time period. In particular, in one embodiment, the first raster point time period to the eighth raster point time period are each different to one another. In particular, the abovementioned raster point time periods can be varied by a random-number generator deterministically or non-deterministically, for example by the control unit 10 shown in FIG. 1.

A further variable which defines the method additionally or alternatively is the time period between scanning one of the abovementioned raster points 19 to 50 and scanning a subsequent one of the abovementioned raster points 19 to 50. In principle, this is a pause between the scanning of one of the abovementioned raster points 19 to 50 and a further one of the abovementioned raster points 19 to 50, as a result of which this time period is referred to in the following text as the point pause time period. In one embodiment, the point pause time period between one of the abovementioned raster points 19 to 50 and a further one of the abovementioned raster points 19 to 50 is varied by the random-number generator in the control unit 10 shown in FIG. 1. It is therefore possible for the point pause time period between one of the abovementioned raster points 19 to 50 and a further one of the abovementioned raster points 19 to 50 to always be chosen to be different. In a further embodiment, as an alternative to this, the point pause time period between one of the abovementioned raster points 19 to 50 and a further one of the abovementioned raster points 19 to 50 can be chosen such that the point pause time period is up to 10%, up to 20%, up to 30%, up to 40%, up to 50%, up to 60%, up to 70%, up to 80% or up to 90% shorter than one of the raster point time periods. As an alternative to this, the point pause time period is chosen such that it corresponds to at least one of the raster point time periods.

In a further method step S8 as shown in FIG. 2, the particle beam is now guided to a further, one of the raster points 19 to 50. The method steps S5 to S8 are carried out again, until the method ends in method step S9.

Results of test examinations which were carried out using a particle beam device 1 as shown in FIG. 1 will be explained in the following text. In this case, an object in the form of an Si110 sample was examined in the STEM mode, in extremely high resolution conditions. Furthermore, magnetic disturbances were produced at a frequency of 50 Hz using an air-cored coil and a function generator. These magnetic disturbances simulated periodic disturbances which could lead to artifacts in an FFT image of the examined object.

Figure 7:
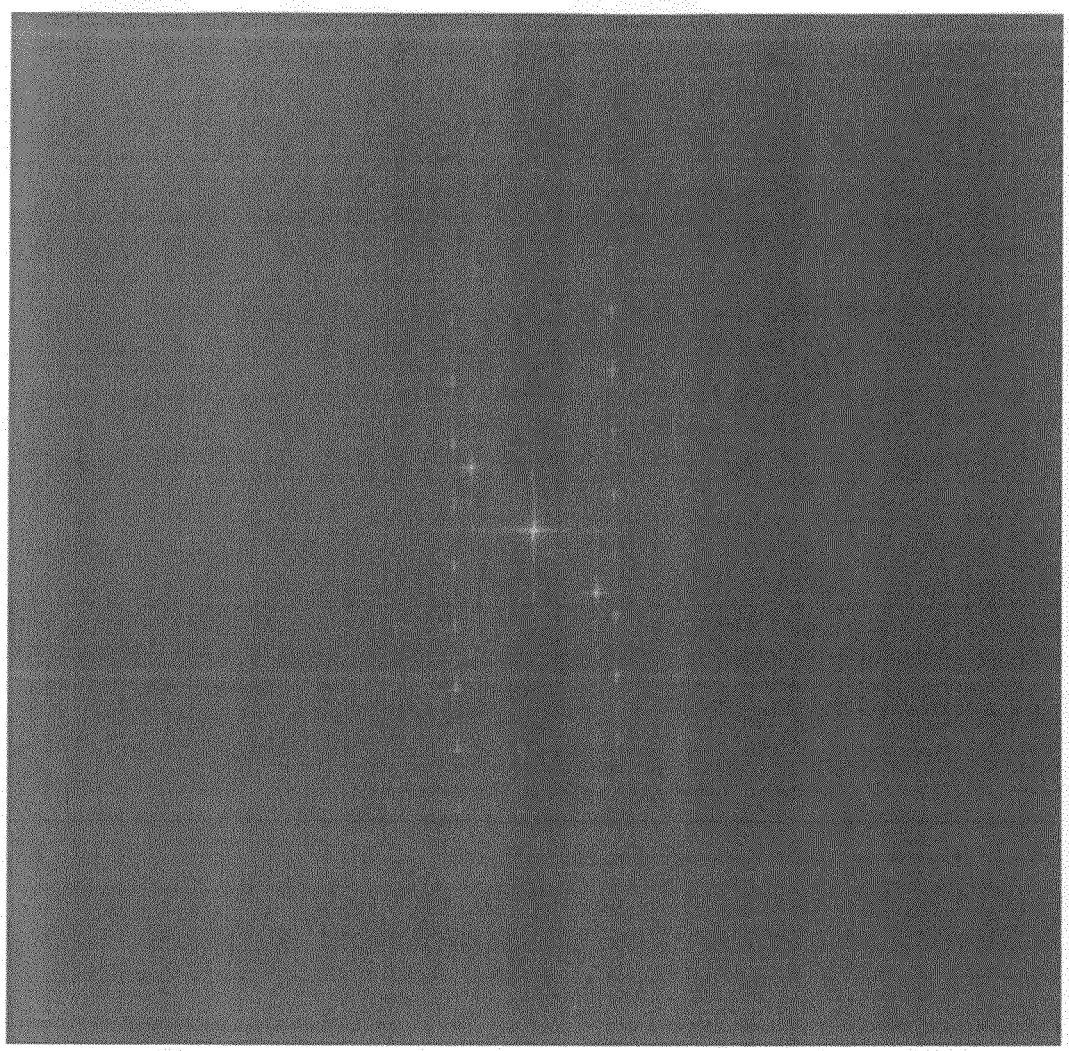
FIG. 7 shows an FFT image of an object, which was produced using a standard raster method according to the prior art.

FIG. 7 shows the Fourier transform of an image (FFT image) of the Si110 sample, which was produced using the standard raster method according to the prior art. The recorded image of the Si110 sample includes 1024 raster lines, each with 1024 raster points. The raster point time period for each of the 1024 raster points was 20 µs. The raster line time period for each raster line was therefore also identical. The FFT image shown in FIG. 7 shows the central reflex and the four characteristic main reflexes, which are arranged around the central reflex, for the Si110 sample. In addition to these five abovementioned reflexes, numerous further reflexes can be identified, which were produced by the disturbance.

Figure 8:
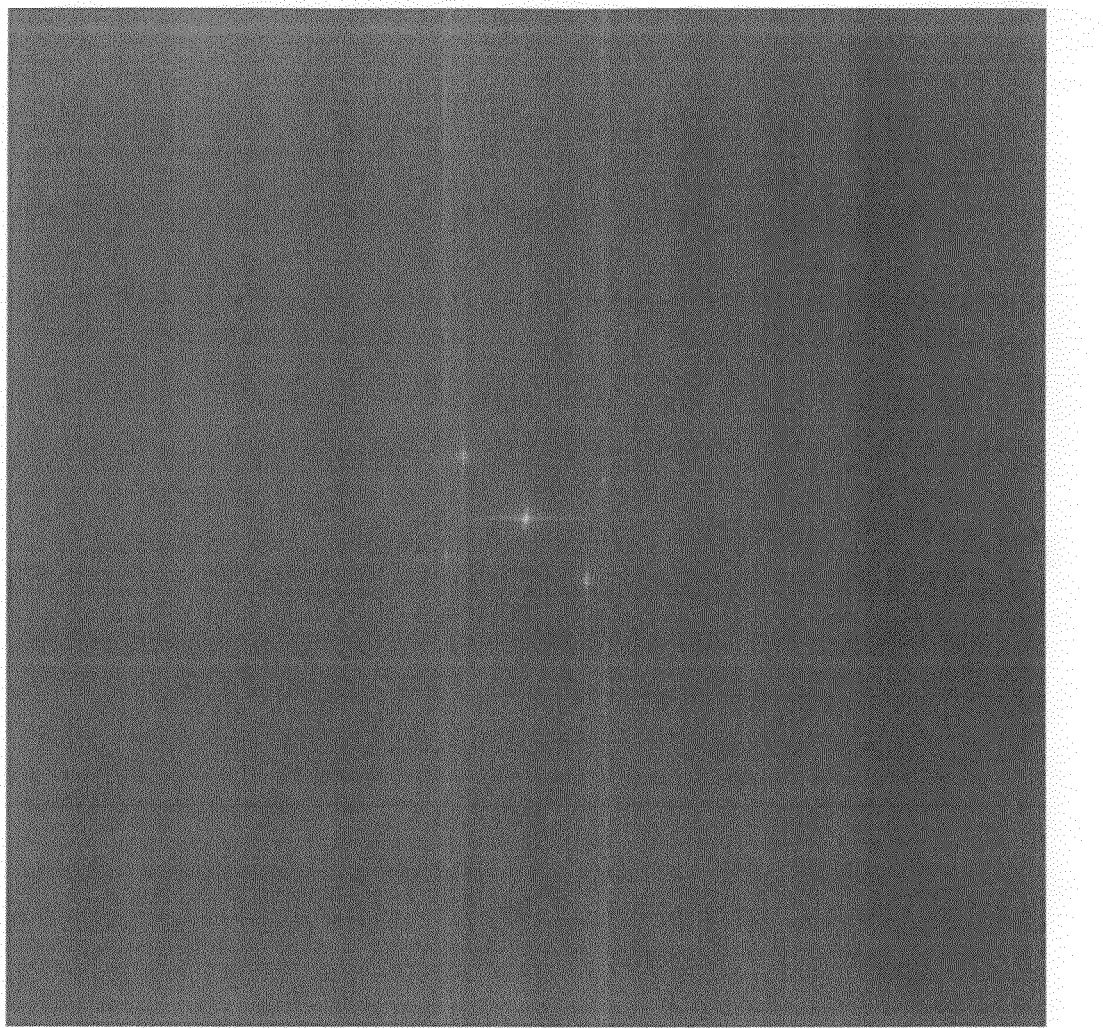
FIG. 8 shows an FFT image of an object, which was produced using a first exemplary embodiment of the method according to the system described herein.

In contrast, FIG. 8 shows the FFT image of the same object, in this case using a line pause period between two raster lines of at most 20% of the raster line time period. The reflexes which could previously be seen as a result of the disturbance in the FFT image are smeared along a vertical, as a result of which vertically aligned strips can be seen. The reflexes actually associated with the examined object, however, can clearly be seen in the FFT image.

Figure 9:
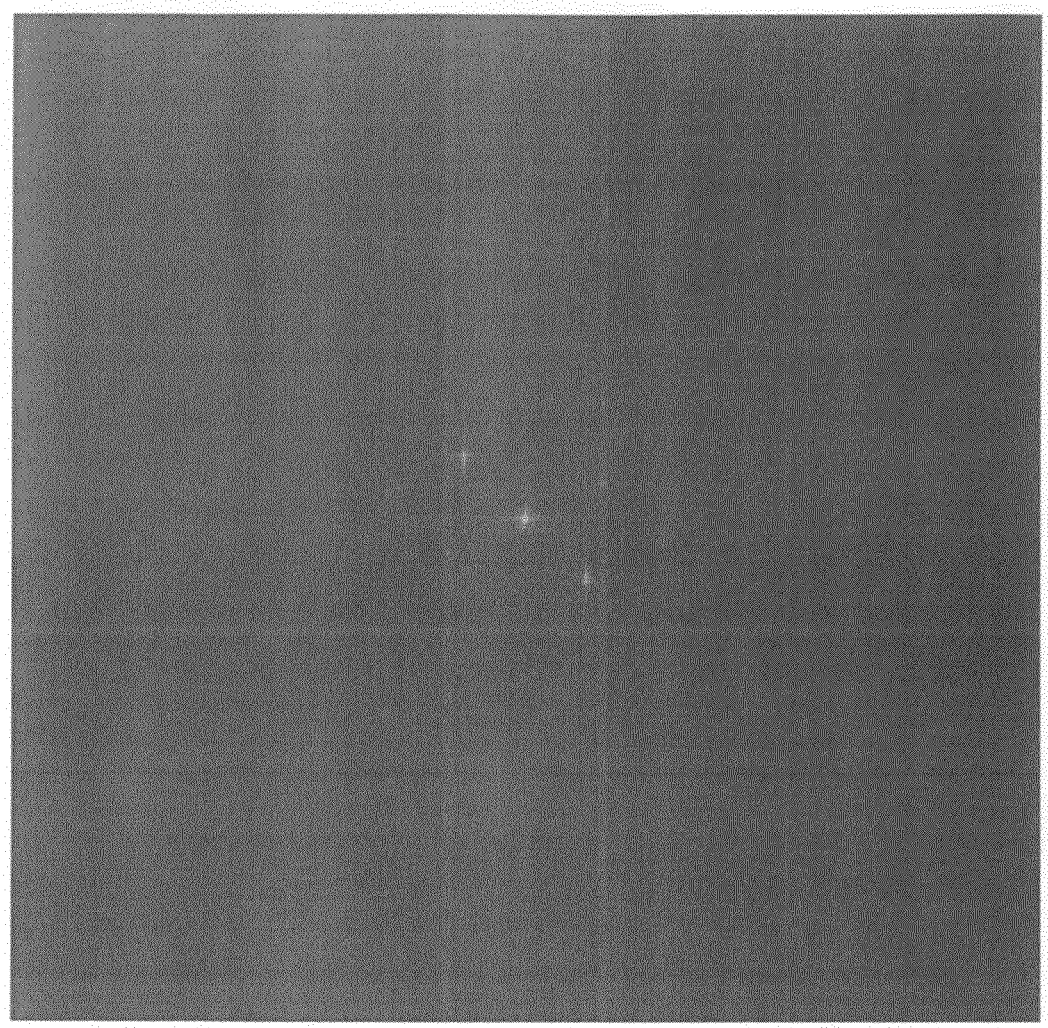
FIG. 9 shows an FFT image of an object, which was produced using a second exemplary embodiment of the method according to the system described herein.

FIG. 9 shows a further exemplary embodiment of an FFT image of the examined object based on the method according to the system described herein. FIG. 9 is fundamentally based on FIG. 8, but with the difference that a line pause period between two raster lines of at most 60% of the raster line time period was used. The reflexes previously produced by the periodic disturbance in the FFT image are smeared to an even greater extent along the vertical than in the exemplary embodiment shown in FIG. 8.

Figure 10:
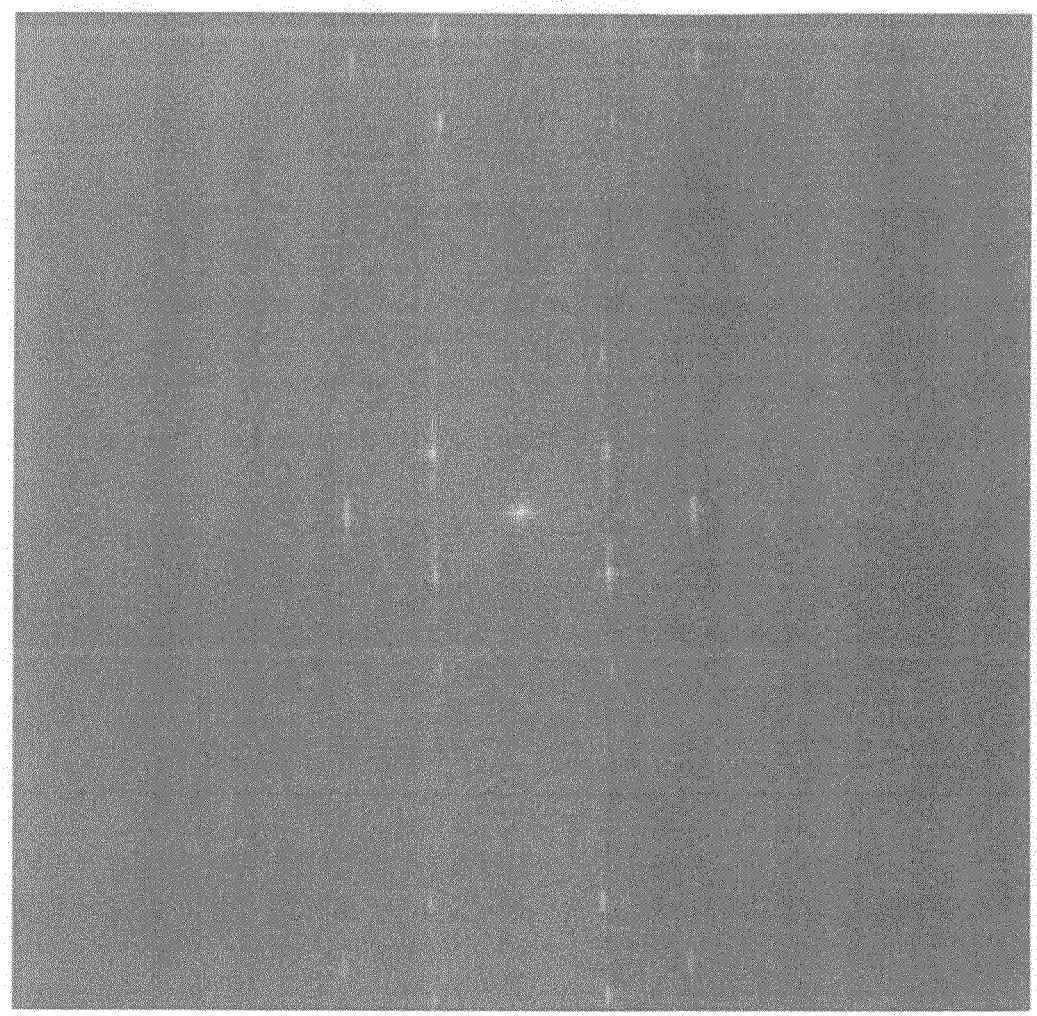
FIG. 10 shows a further FFT image of an object which was produced using a standard raster method according to the prior art.
Figure 11:
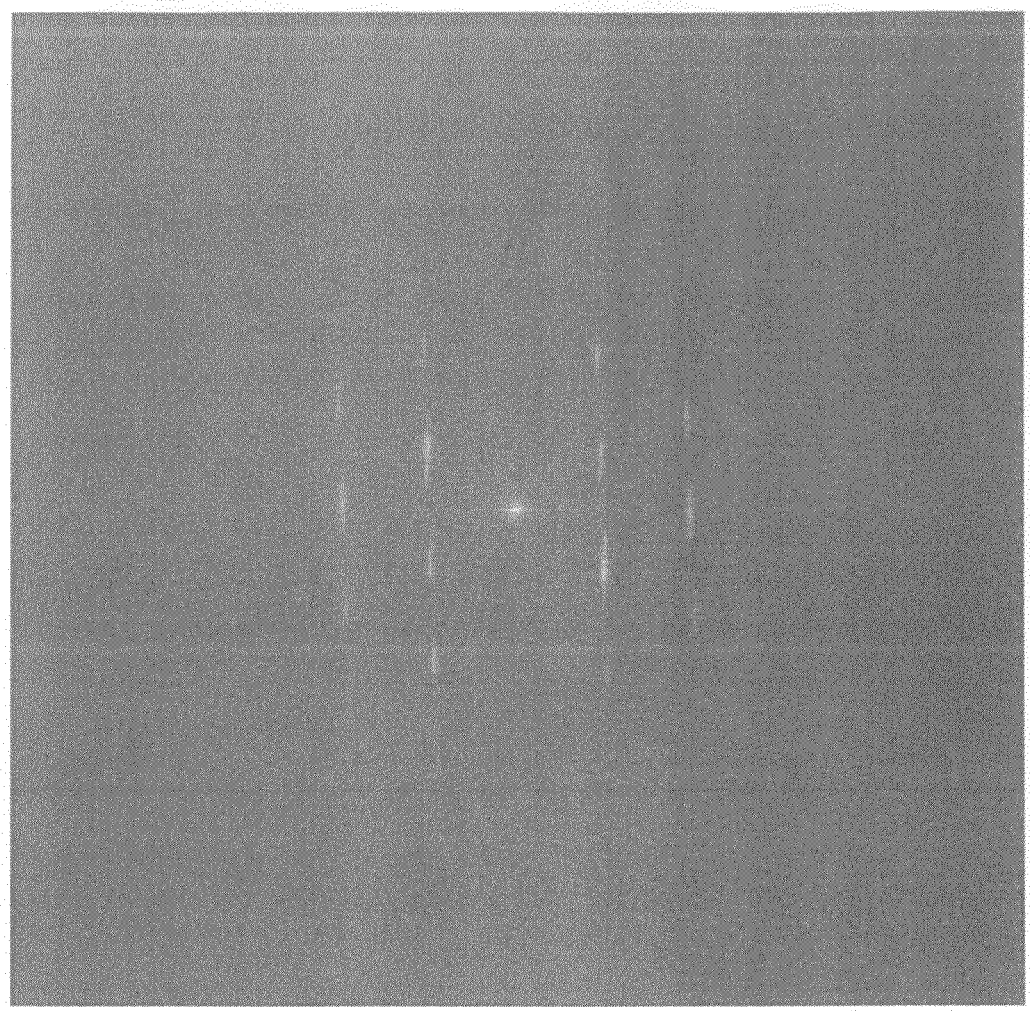
FIG. 11 shows an FFT image of an object which was produced using a third exemplary embodiment of the method according to the system described herein.

FIG. 10 shows an FFT image of the examined object, in which the standard raster method according to the prior art was used. The recorded image once again contains 1024 raster lines, each having 1024 raster points. The raster point time period of the particle beam at each raster point was 18 µs. The FFT image shown in FIG. 10 exhibits reflexes at the upper image edge and at the lower image edge, which reflexes originate from the periodic disturbance. FIG. 11 shows an FFT image of the object, in which the raster point time period was varied such that these values were up to at most 100% of the original raster point time period (18 µs). The reflexes at the upper image edge and at the lower image edge have virtually completely disappeared. It has been found that variation of the raster point time period in particular reduces reflexes of disturbances which are at a frequency of considerably more than 50 Hz.

Figure 12:
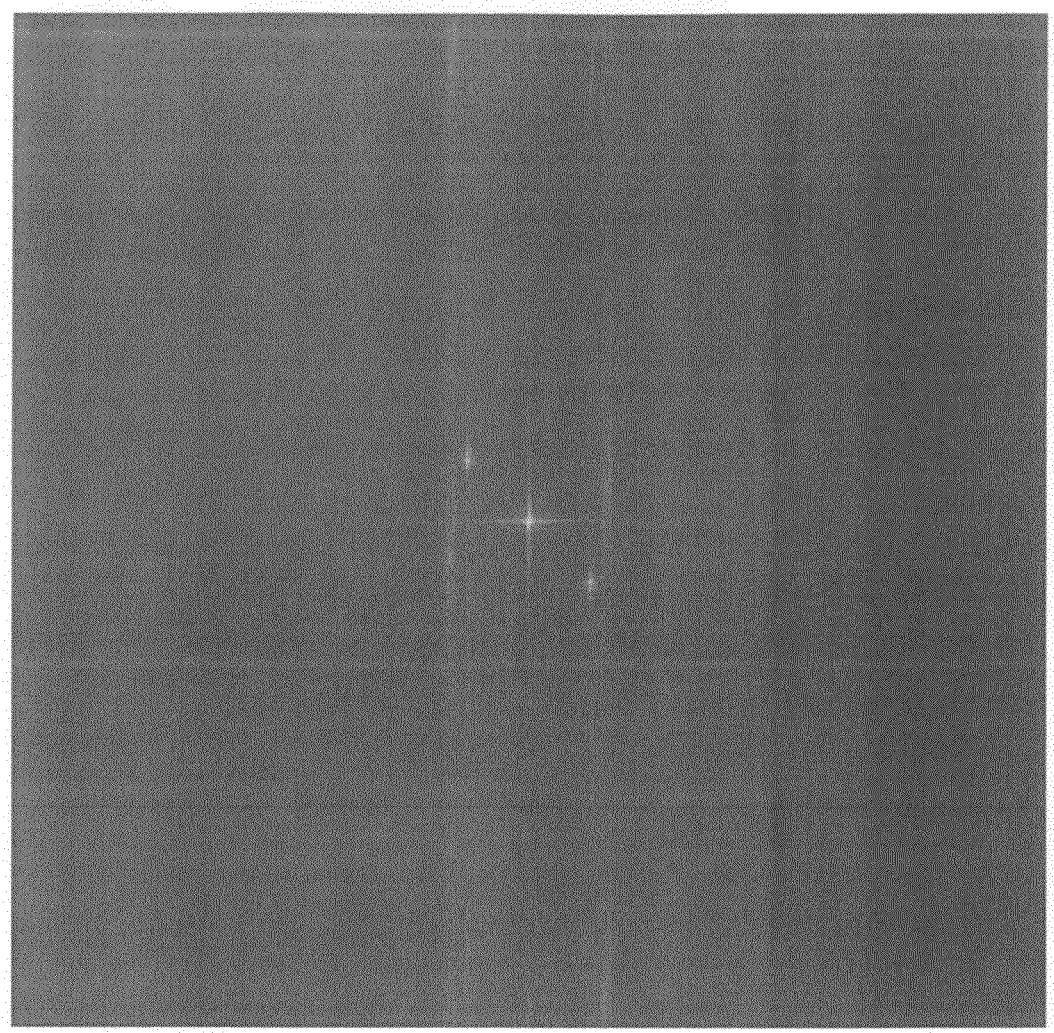
FIG. 12 shows an FFT image of an object which was produced using a fourth exemplary embodiment of the method according to the system described herein.
Figure 13:
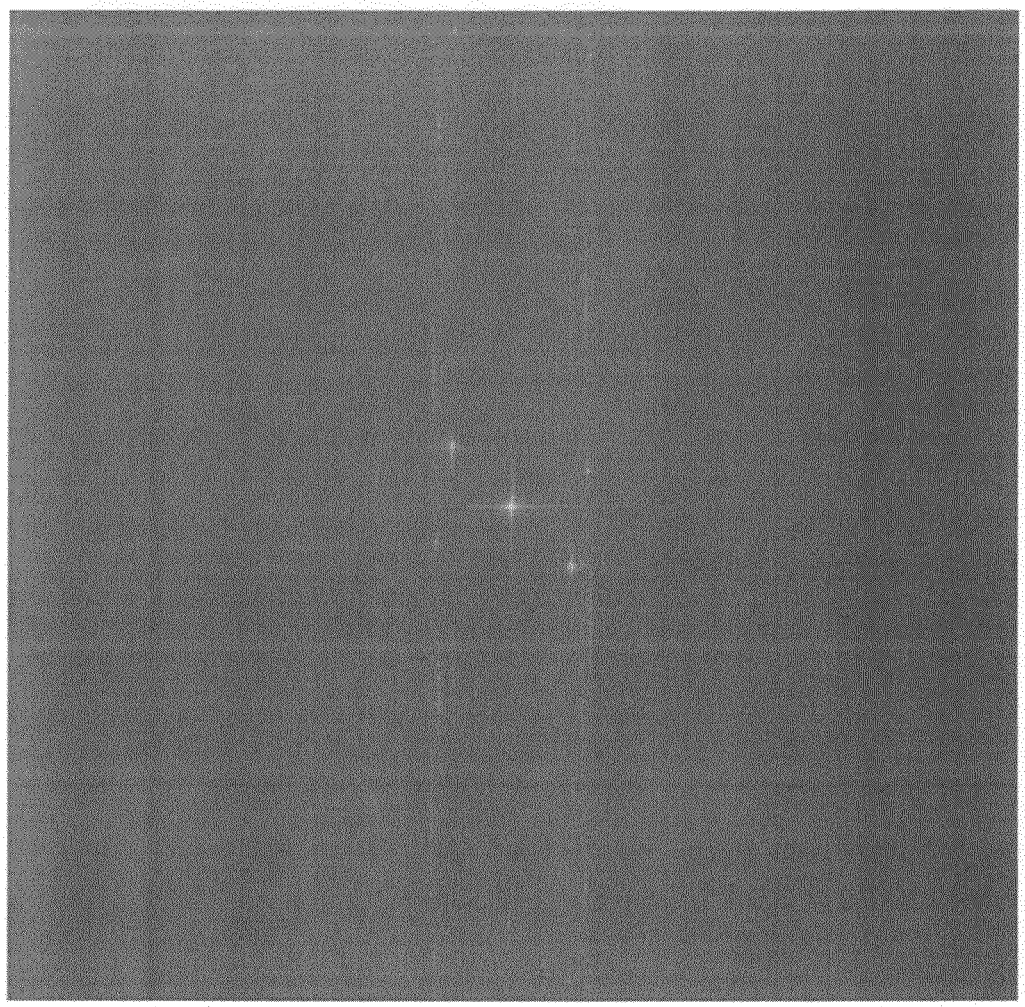
FIG. 13 shows an FFT image of an object which was produced using a fifth exemplary embodiment of the method according to the system described herein.
Figure 14:
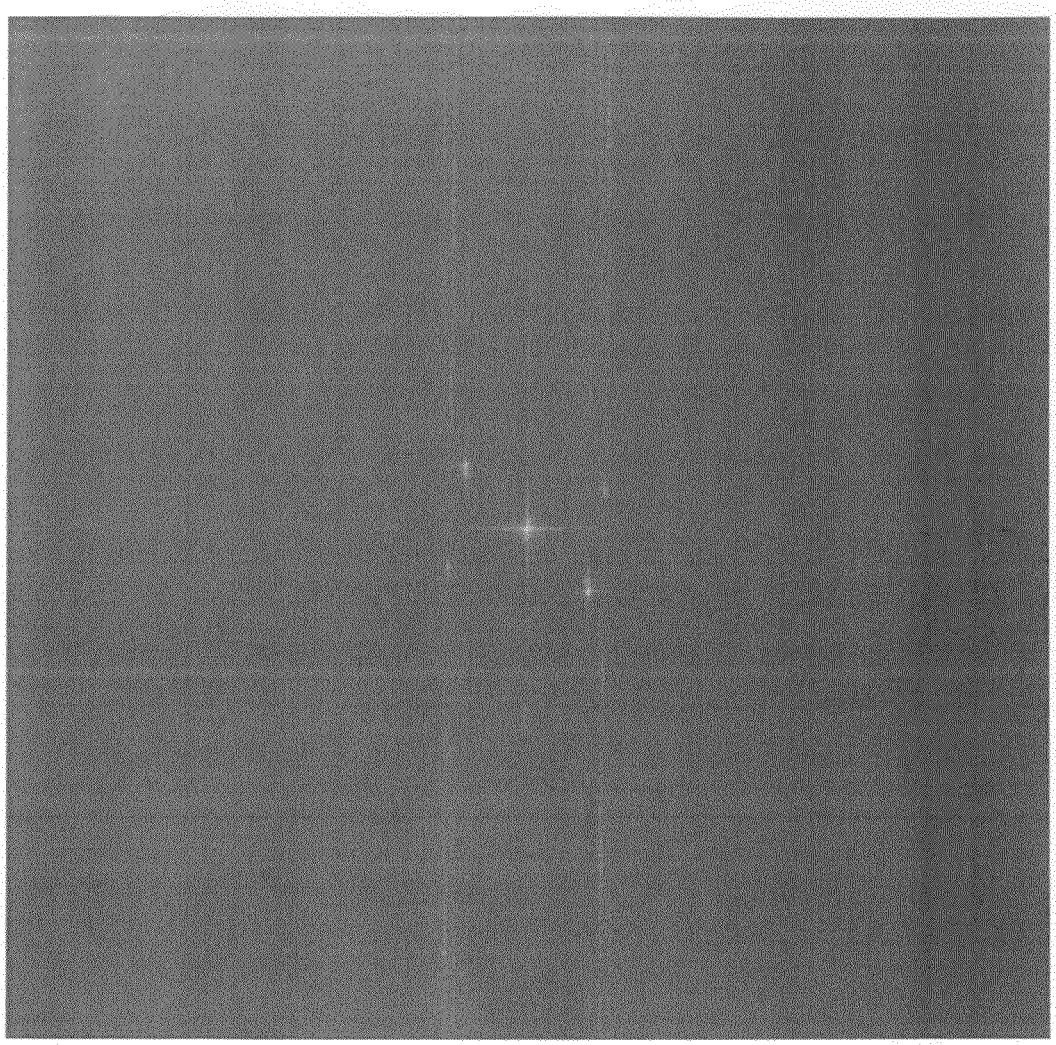
FIG. 14 shows an FFT image of an object which was produced using a sixth exemplary embodiment of the method according to the system described herein.
Figure 15:
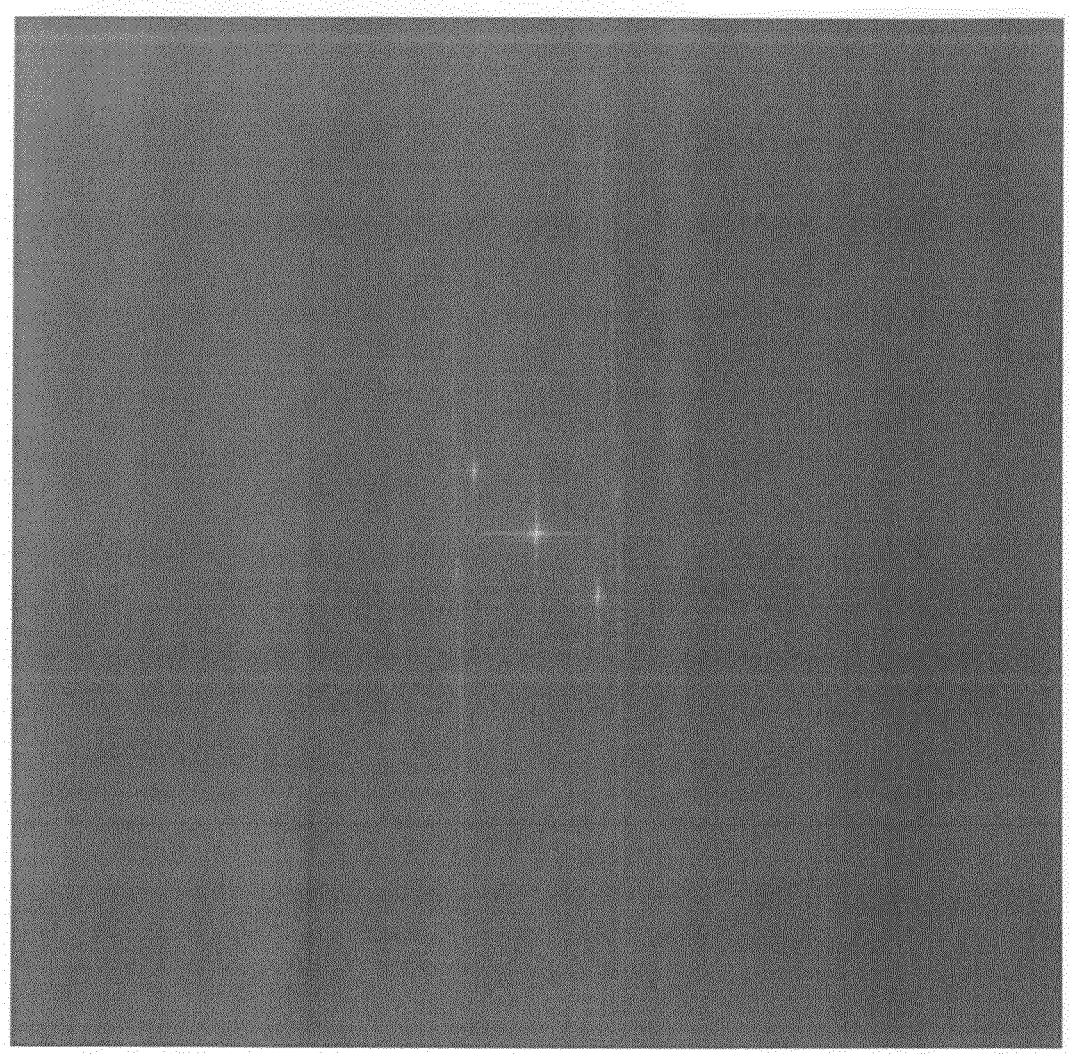
FIG. 15 shows an FFT image of an object which was produced using a seventh exemplary embodiment of the method according to the system described herein.

A further exemplary embodiment is illustrated in FIGS. 12 to 15, which show FFT images of the examined object. FIG. 7 is the reference image from the prior art relating to FIGS. 12 to 15. The further exemplary embodiments shown in FIGS. 12 to 15 are based on the exemplary embodiment shown in FIG. 11. However, in addition, the maximum possible raster point time period along the line was also modulated periodically, as a result of which the time variation also has even greater fluctuations between pixels which are a long distance apart from one another within one line. FIG. 12 shows an FFT image of the examined object, in which the raster point time period was varied such that this was lengthened at most by 25% of the original raster point time period (20 µs). FIG. 13 shows an FFT image of the examined object, in which the raster point time period was varied such that this was lengthened by at most 50% of the original raster point time period (20 µs). FIG. 14 shows an FFT image of the examined object in which the raster point time period was varied such that it was lengthened by at most 75% of the original raster point time period (20 µs). FIG. 15 once again shows an FFT image of the examined object, in which the raster point time period was varied such that this was lengthened at most by 100% of the original raster point time period (20 µs). As can be seen in all the exemplary embodiments shown in FIGS. 12 to 15, the reflexes which are caused by the periodic disturbance have decreased in comparison to the FFT image shown in FIG. 7.

Figure 16:
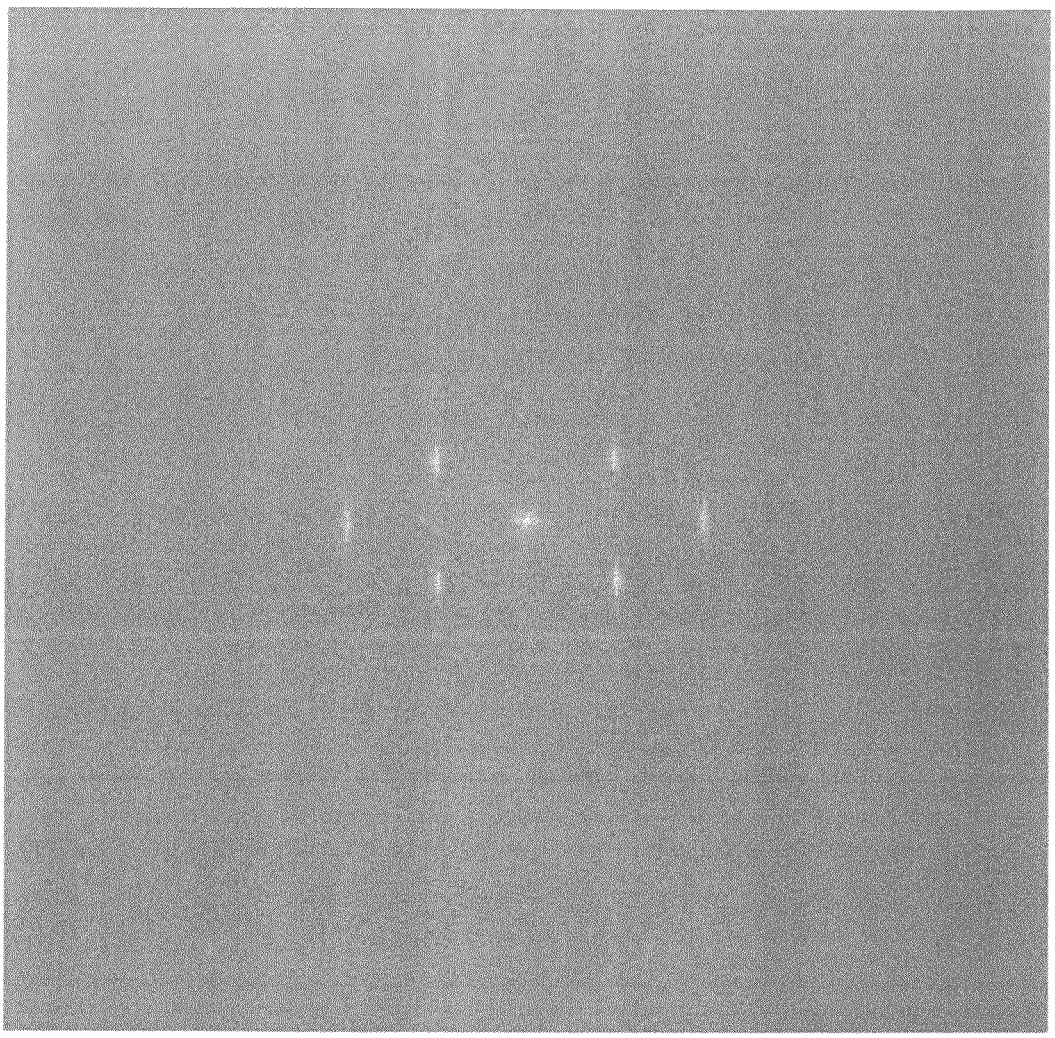
FIG. 16 shows an FFT image of an object which was produced using an eighth exemplary embodiment of the method according to the system described herein.

Each of the abovementioned exemplary embodiments can be combined with a further one of the abovementioned exemplary embodiment's. For example, in one exemplary embodiment, variation of the line pause time period and raster point time period are combined. FIG. 16 shows the result of this combination, wherein the line pause time period was varied such that this was lengthened by up to at most 20% of the original raster line time period. The raster point time period was lengthened by values up to at most 70% of the original raster point time period (20 µs). FIG. 10 represents the reference according to the prior art for FIG. 16.

The abovementioned exemplary embodiments of the method according to the system described herein serve to cancel out the correlation between the time profile of the detected signal (which has the fluctuations which are periodic over time) and the respective position associated with the detected signal on the object. Better representations of the object can be achieved, in which the disturbing artifacts are now only greatly restricted or are even no longer perceptible at all. This is achieved by varying at least one of the abovementioned time periods.

A further exemplary embodiment of the method according to the system described herein will now be explained with reference to FIG. 6C. In this exemplary embodiment, it is not essential to vary the line pause time period, the raster point time period and/or the point pause time period. The abovementioned time periods may also all be kept constant. As already explained above, the third raster pattern shown in FIG. 6C includes a spiral scan of the raster area 17. The guidance of the particle beam over the raster area 17 is indicated by arrows. In the raster pattern shown in FIG. 6C, the particle beam passes through the abovementioned raster points in the form already described above. Because of the movements which are predetermined by the raster pattern, there are different time intervals between one raster point and its adjacent raster points, wherein a time interval is given by the difference between the respective times at which two adjacent raster points are in each case scanned. For example, the tenth raster point 28 has the following adjacent raster points: the second raster point 20, the ninth raster point 27, the eleventh raster point 29 and the eighteenth raster point 36. The time interval between the times at which the second raster point 20 and the tenth raster point 28 are scanned is different to the time interval between the times at which the ninth raster point 27 and the tenth raster point 28 are scanned. The time interval between the times at which the eleventh raster point (or the eighteenth raster point 36) and the tenth raster point 28 are scanned is also different to the abovementioned time intervals. The different time intervals are likewise not correlated, as a result of which, in this method as well, disturbing artifacts in an FFT image are only greatly restricted, or are even no longer perceptible at all.

All the exemplary embodiments of the method as described above also allow the particle beam to pass over the raster area 17 more than once. In this case, at least one first image and at least one second image are produced. The first image and the second image are then combined using an averaging method or an integration method to form a final representation. Further embodiments provide for the particle beam to be passed over the raster area 17 more than twice, and for each of the images produced in this way to be combined with one another. This results in particularly good low-noise images of the object.

Figure 17:
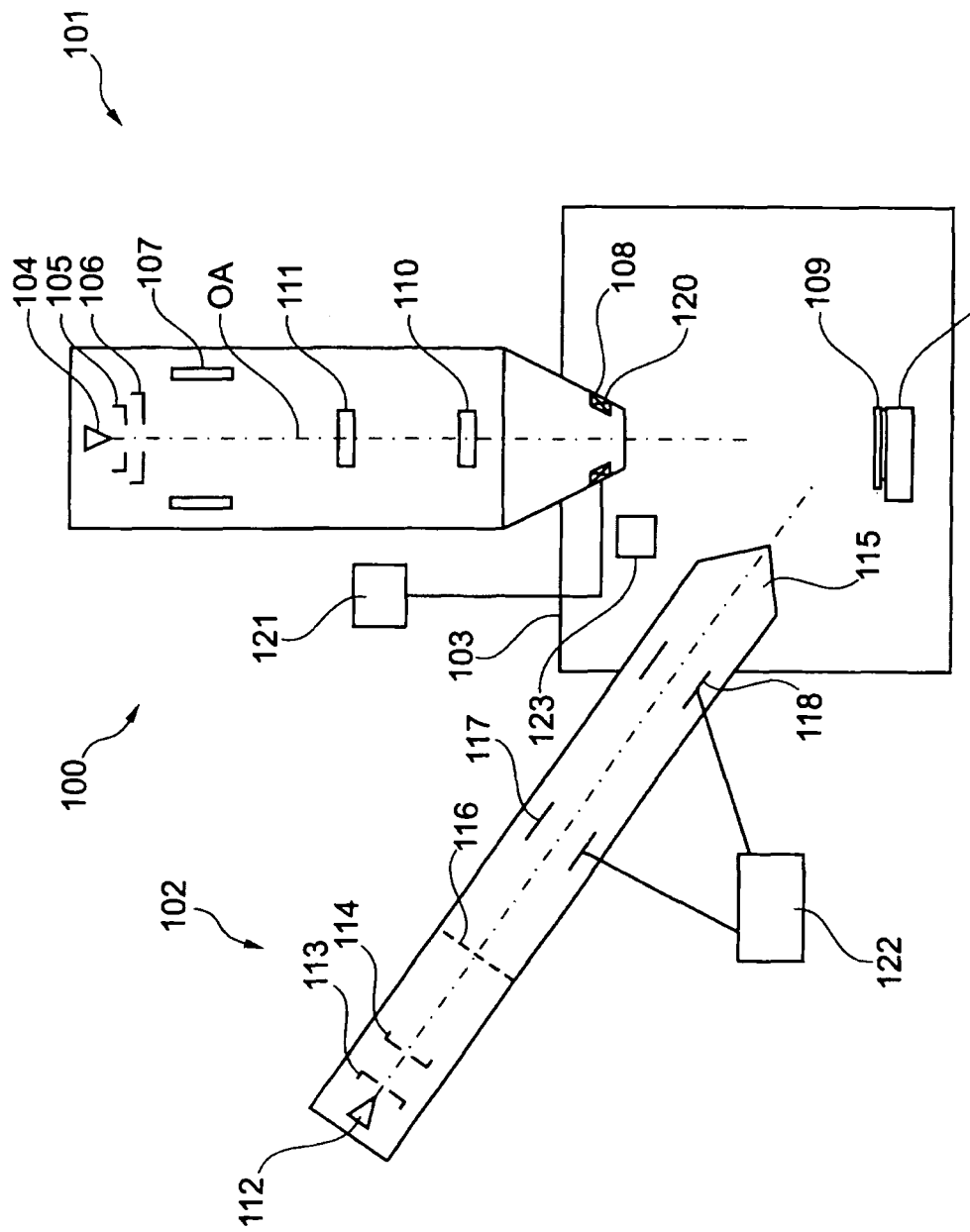
FIG. 17 shows a further particle beam device according to an embodiment of the system described herein.

FIG. 17 shows a schematic illustration of a further particle beam device 100 using which the method according to the system described herein can be carried out. The particle beam device 100 has two particle beam columns, specifically a first particle beam column 101 and a second particle beam column 102, which are arranged on a sample chamber 103. The first particle beam column 101 is in the form of an electron beam column, and is arranged vertically with respect to the sample chamber 3.

The first particle beam column 101 has a first beam generator 104 in the form of an electron source (cathode), and a system consisting of a first electrode unit 105 and a second electrode unit 106. The second electrode unit 106 forms one end of a beam guidance tube (not illustrated). For example, the first beam generator 104 is in the form of a thermal field emitter. Electrons which emerge from the first beam generator 104 are accelerated to a predeterminable potential because of a potential difference between the first beam generator 104 and the second electrode unit 106, and form a primary electron beam.

The primary electron beam first of all passes through a condenser unit 107 and then through a first objective 108 in the form of a magnetic lens. The beam guidance tube is passed through an opening in the first objective 108. The first objective 108 is provided with pole shoes (not illustrated), in which coils (not illustrated) are arranged. Furthermore, raster device 120 is provided, using which the primary electron beam can be deflected and can be scanned over an object 109 which is arranged in the sample chamber 103. The object 109 is arranged on an adjustable object holder (not illustrated). The object holder is designed such that it can move in three directions (x direction, y direction and z direction) which are arranged at right angles to one another. Furthermore, it can preferably rotate about a first rotation axis and a second rotation axis, with the first rotation axis and the second rotation axis being arranged at right angles to one another.

For imaging, secondary electrons and/or back-scattered electrons which are created as a result of the interaction of the primary electron beam with the object 109 are detected by a detector arrangement in the first particle beam column 101. For this purpose, a first detector 110 is provided on the object side along the optical axis OA of the first particle beam column 101, while a second detector 111 is arranged along the optical axis OA on the source side (that is to say in the direction of the first beam generator 104). Furthermore, the first detector 110 and the second detector 111 are arranged offset with respect to one another.

The second particle beam column 102 is in the form of an ion beam column, and is arranged tilted through an angle of about 50° with respect to the first particle beam column 101. The second particle beam column 102 has a second beam generator 112 in the form of an ion beam generator. The second beam generator 112 generates ions, which form an ion beam. By way of example, the ion beam is formed from noble-gas ions. By way of example, the ion beam can be formed from argon ions. However, the system described herein is not restricted to argon ions. In fact, other ion types can also be used, for example gallium ions, gold ions, silicon ions and/or helium ions.

The ions are accelerated to a predeterminable potential using an extraction electrode 113. The ion beam then passes through ion optics in the second particle beam column 102, in which case the ion optics have a condenser lens 114 and an arrangement of further lenses as a second objective lens 115. The second objective lens 115 produces a focused ion probe, which strikes the object 109. An adjustable stop 116, a first electrode arrangement 117 and a second electrode arrangement 118 are arranged above the second objective lens 115 (that is to say in the direction of the second beam generator 112), with the first electrode arrangement 117 and the second electrode arrangement 118 being in the form of raster electrodes. The ion beam is scanned over the surface of the object 109 using the first electrode arrangement 117 and the second electrode arrangement 118.

The second particle beam column 102 has two functions. On the one hand, it can be used for imaging an area of interest on the surface of the object 109. Interaction particles are detected by a fourth detector 123 and/or by the first detector 110 and/or the second detector 111. On the other hand, however, it is also used for processing the area of interest on the surface of the object 109.

Furthermore, a third detector 119 is arranged in the sample chamber 103. The third detector 119 is used to detect interaction particles transmitted by the object 109 or scattered by the object 109.

The raster device 120 is connected to a first control unit 121 and is controlled by the first control unit 121, with the first control unit 121 having a first processor with an appropriate program code. The raster device 120 can be used to scan the first particle beam in the form of the electron beam over the object 109.

Both the first electrode arrangement 117 and the second electrode arrangement 118 are connected to a second control unit 122. The second control unit 122 controls the first electrode arrangement 117 and the second electrode arrangement 118, with the second control unit 122 having a second processor with a corresponding program code. The first electrode arrangement 117 and the second electrode arrangement 118 can be used to scan the ion beam over the object 109.

Artifacts in an image of the object 109 can likewise occur when using the further particle beam device 100. When both the electrode beam and the ion beam are scanned at the same time, then, fundamentally, this results in a combined image of two interleaved images, with one of the images being governed by the electron beam, and the other of the images being governed by the ion beam. If periodic control signals are used for guidance of the electron beam and of the ion beam over the raster area of the object 109, it is possible for one of the two particle beams (for example the electron beam) to be guided over the raster area of the object 109 more quickly than the other of the two particle beams (for example the ion beam). When both particle beams pass through the raster area, it is possible for the combined image to contain strips since the one particle beam has already passed completely over the raster area while the other particle beam is still passing over the raster area. The abovementioned strips are produced precisely at these times. These strips can be removed from the combined image by carrying out the methods described above both on the first particle beam column 101 and on the second particle beam column 102.

It should be explicitly noted that the first particle beam column 101 and the second particle beam column 102" may each be in the form of an ion beam column.

Various embodiments discussed herein may be combined with each other in appropriate combinations in connection with the system described herein. Additionally, in some instances, the order of steps in the flowcharts, flow diagrams and/or described flow processing may be modified, where appropriate. Further, various aspects of the system described herein may be implemented using software, hardware, a combination of software and hardware and/or other computer-implemented modules or devices having the described features and performing the described functions. Software implementations of the system described herein may include executable code that is stored in a computer readable storage medium and executed by one or more processors. The computer readable storage medium may include a computer hard drive, ROM, RAM, flash memory, portable computer storage media such as a CD-ROM, a DVD-ROM, a flash drive and/or other drive with, for example, a universal serial bus (USB) interface, and/or any other appropriate tangible storage medium or computer memory on which executable code may be stored and executed by a processor. The system described herein may be used in connection with any appropriate operating system.

Other embodiments of the invention will be apparent to those skilled in the art from a consideration of the specification or practice of the invention disclosed herein. It is intended that the specification and examples be considered as exemplary only, with the true scope and spirit of the invention being indicated by the following claims.

What is claimed is:

1. A method for producing a representation of an object using a particle beam, wherein the particle beam is made available by a particle beam device having at least one particle beam column, wherein the particle beam column has a beam generator for producing a particle beam, and has an objective lens for focusing the particle beam onto the object, the method comprising:

defining at least one raster area on the object, wherein the raster area has a multiplicity of raster lines, wherein the multiplicity of raster lines have at least one first raster line and at least one second raster line, wherein the first raster line has a multiplicity of raster points which include at least one first raster point and at least one second raster point, and wherein the second raster line has a multiplicity of further raster points, which include at least one third raster point and at least one fourth raster point;

defining at least one raster pattern, wherein the raster pattern defines guidance of the particle beam through the raster area;

generating the particle beam;

passing the particle beam to the first raster point, the second raster point, the third raster point and the fourth raster point;

guiding the particle beam in accordance with the raster pattern over the raster area, wherein the particle beam remains at the first raster point for a first time period, the second raster point for a second time period, the third raster point for a third time period and the fourth raster point for a fourth time period, wherein there is a fifth time period between guidance of the particle beam over the first raster line and guidance of the particle beam over the second raster line, wherein the multiplicity of raster lines result in a multiplicity of fifth time periods, and wherein, during guidance of the particle beam, there is a sixth time period between scanning of one of the following raster points, specifically the first raster point, the second raster point, the third raster point or the fourth raster point, using the particle beam, and scanning a further and different one of the following raster points: the first raster point, the second raster point, the third raster point or the fourth raster point, wherein the multiplicity of raster points result in a multiplicity of sixth time periods; and detecting at least one of: interaction particles or interaction radiation, wherein the at least one of: the interaction particles or the interaction radiation are or is created by interaction of the particle beam with the object, wherein at least one of the following time periods: the first time period, the second time period, the third time period, the fourth time period, the fifth time period and the sixth time period, is randomly varied within one raster area.

2. The method according to claim 1, wherein the method further includes at least one of the following features:

the first time period, the second time period, the third time period and the fourth time period form a first sequence for the raster area, wherein the first sequence is subdivided into at least one first area of the first sequence and at least one second area of the first sequence, wherein at least the time periods which are included in the first area of the first sequence are randomly varied deterministically or non-deterministically;

the multiplicity of fifth time periods form a second sequence for the raster area, wherein the second sequence is subdivided into at least one first area of the second sequence and at least one second area of the second sequence, wherein at least the fifth time periods which are included in the first area of the second sequence are randomly varied deterministically or non-deterministically; or the multiplicity of sixth time periods form a third sequence for the raster area, wherein the third sequence is subdivided into at least one first area of the third sequence and at least one second area of the third sequence, wherein at least the sixth time periods which are included in the first area of the third sequence are randomly varied deterministically or non-deterministically.

3. The method according to claim 1, wherein the raster pattern is defined such that the particle beam is first of all passed over the first raster line and then over the second raster line in the raster area.

4. The method according to claim 1, wherein the raster pattern is defined such that the particle beam is guided through the raster area in the following sequence: first of all to the first raster point in the first raster line, then to the second raster point in the first raster line, then to the fourth raster point in the second raster line, and then to the third raster point in the second raster line.

5. The method according to claim 1, wherein the raster pattern is defined such that it has a rectangular and spiral shape.

6. The method according to claim 1, wherein the method further comprises at least one of the following features:

the fifth time period is varied using a first random-number generator; or the fifth time period is varied such that the fifth time period is up to 5%, up to 10%, up to 20%, up to 30%, up to 40%, up to 50% or up to 70% shorter than the sum of the first time period and the second time period, or the sum of the third time period and the fourth time period.

7. The method according to claim 1, wherein the method further comprises at least one of the following features:

the sixth time period is varied using a second random-number generator;

the sixth time period is varied such that the sixth time period is up to 10%, up to 20%, up to 30%, up to 40%, up to 50%, up to 60%, up to 70%, up to 80% or up to 90% shorter than the first time period, the second time period, the third time period or the fourth time period; or the sixth time period is varied such that the sixth time period corresponds to at least one of: the first time period, the second time period, the third time period or the fourth time period.

8. The method according to claim 1, wherein the method further comprises at least one of the following features:

at least one of: the first time period, the second time period, the third time period and the fourth time period is varied such that the first time period is different from the second time period, from the third time period and from the fourth time period;

at least one of: the first time period, the second time period, the third time period and the fourth time period is varied such that the second time period is different from the first time period, from the third time period and from the fourth time period, at least one of: the first time period, the second time period, the third time period and the fourth time period is varied such that the third time period is different from the first time period, from the second time period and from the fourth time period; or at least one of: the first time period, the second time period, the third time period and the fourth time period is varied such that the fourth time period is different from the first time period, from the second time period and from the third time period.

9. The method according to claim 1, wherein the particle beam is guided over the raster area at least a first time in order to produce a first representation and over the raster area at least a second time in order to produce a second representation, wherein the first representation and the second representation are produced using different raster parameters, and wherein the first representation and the second representation are combined using an averaging method to form a final representation.

10. A non-transitory computer readable medium storing computer software for producing a representation of an object using a particle beam, wherein the particle beam is made available by a particle beam device having at least one particle beam column, wherein the particle beam column has a beam generator for producing a particle beam, and has an objective lens for focusing the particle beam onto the object, the computer software comprising:

executable code that defines at least one raster area on the object, wherein the raster area has a multiplicity of raster lines, wherein the multiplicity of raster lines have at least one first raster line and at least one second raster line, wherein the first raster line has a multiplicity of raster points which include at least one first raster point and at least one second raster point, and wherein the second raster line has a multiplicity of further raster points, which include at least one third raster point and at least one fourth raster point;

executable code that defines at least one raster pattern, wherein the raster pattern defines guidance of the particle beam through the raster area;

executable code that controls generation of the particle beam;

executable code that passes the particle beam to the first raster point, the second raster point, the third raster point and the fourth raster point;

executable code that guides the particle beam in accordance with the raster pattern over the raster area, wherein the particle beam remains at the first raster point for a first time period, the second raster point for a second time period, the third raster point for a third time period and the fourth raster point for a fourth time period, wherein there is a fifth time period between guidance of the particle beam over the first raster line and guidance of the particle beam over the second raster line, wherein the multiplicity of raster lines result in a multiplicity of fifth time periods, and wherein, during guidance of the particle beam, there is a sixth time period between scanning of one of the following raster points, specifically the first raster point, the second raster point, the third raster point or the fourth raster point, using the particle beam, and scanning of a further and different one of the following raster points: the first raster point, the second raster point, the third raster point, or the fourth raster point, wherein the multiplicity of raster points result in a multiplicity of sixth time periods; and executable code that detects at least one of: interaction particles or interaction radiation, wherein the at least one of: the interaction particles or the interaction radiation are or is created by interaction of the particle beam with the object, wherein at least one of the following time periods: the first time period, the second time period, the third time period, the fourth time period, the fifth time period or the sixth time period is randomly varied within one raster area.

11. A particle beam device, comprising:

at least one first particle beam column, wherein the first particle beam column has a first beam generator for generating a first particle beam, and a first objective lens for focusing the first particle beam onto an object;

at least one first raster device for guiding the first particle beam over the object;

at least one first detection unit for detection of at least one of: interaction particles or interaction radiation; and at least one monitoring unit, wherein the at least one monitoring unit includes a computer readable medium storing computer software that includes:

executable code that defines at least one raster area on the object, wherein the raster area has a multiplicity of raster lines, wherein the multiplicity of raster lines have at least one first raster line and at least one second raster line, wherein the first raster line has a multiplicity of raster points which include at least one first raster point and at least one second raster point, and wherein the second raster line has a multiplicity of further raster points, which include at least one third raster point and at least one fourth raster point;

executable code that defines at least one raster pattern, wherein the raster pattern defines guidance of the particle beam through the raster area;

executable code that controls generation of the particle beam;

executable code that passes the particle beam to the first raster point, the second raster point, the third raster point or the fourth raster point;

executable code that guides the particle beam in accordance with the raster pattern over the raster area, wherein the particle beam remains at the first raster point for a first time period, the second raster point for a second time period, the third raster point for a third time period and the fourth raster point for a fourth time period, wherein there is a fifth time period between guidance of the particle beam over the first raster line and guidance of the particle beam over the second raster line, wherein the multiplicity of raster lines result in a multiplicity of fifth time periods, and wherein, during guidance of the particle beam, there is a sixth time period between scanning of one of the following raster points, specifically the first raster point, the second raster point, the third raster point or the fourth raster point, using the particle beam, and scanning of a further and different one of the following raster points: the first raster point, the second raster point, the third raster point, or the fourth raster point, wherein the multiplicity of raster points result in a multiplicity of sixth time periods; and executable code that controls detection of at least one of: the interaction particles or the interaction radiation, wherein the at least one of: the interaction particles or the interaction radiation are or is created by interaction of the particle beam with the object, wherein at least one of the following time periods: the first time period, the second time period, the third time period, the fourth time period, the fifth time period or the sixth time period is randomly varied within one raster area.

12. A particle beam device, comprising:

at least one first particle beam column, wherein the first particle beam column has a first beam generator for generating a first particle beam, and a first objective lens for focusing the first particle beam onto an object;

at least one first control unit for defining a first raster area on the object and for defining a first raster pattern, wherein the first raster area has a multiplicity of raster lines, wherein the multiplicity of raster lines have at least one first raster line and at least one second raster line, wherein the first raster line has a multiplicity of raster points which include at least one first raster point and at least one second raster point, and wherein the second raster line has a multiplicity of further raster points which include at least one third raster point and at least one fourth raster point, and wherein the first raster pattern defines guidance of the first particle beam through the first raster area;

at least one first raster device for guiding the first particle beam over the object, wherein the first particle beam remains at the first raster point for a first time period, the second raster point for a second time period, the third raster point for a third time period and the fourth raster point for a fourth time period, wherein there is a fifth time period between guidance of the particle beam over the first raster line and guidance of the particle beam over the second raster line, wherein the multiplicity of raster lines result in a multiplicity of fifth time periods, and wherein, during guidance of the particle beam, there is a sixth time period between scanning of one of the following raster points, specifically the first raster point, the second raster point, the third raster point or the fourth raster point, using the particle beam, and scanning of a further and different one of the following raster points: the first raster point, the second raster point, the third raster point, or the fourth raster point, wherein the multiplicity of raster points result in a multiplicity of sixth time periods;

at least one first detection unit for detection of at least one of: interaction particles or interaction radiation; and at least one second control unit for randomly varying within one raster area at least one of the following time periods: the first time period, the second time period, the third time period, the fourth time period, the fifth time period or the sixth time period.

13. The particle beam device according to claim 12, wherein the second control unit provides that at least one of the following time periods is randomly varied deterministically or non-deterministically: the first time period, the second time period, the third time period, the fourth time period, the fifth time period or the sixth time period.

14. The particle beam device according to claim 12, wherein the second control unit provides at least one of the following features:

the first time period, the second time period, the third time period and the fourth time period form a first sequence for the raster area, wherein the first sequence is subdivided into at least one first area of the first sequence and at least one second area of the first sequence, wherein at least the time periods which are included in the first area of the first sequence are randomly varied deterministically or non-deterministically, the multiplicity of fifth time periods form a second sequence for the raster area, wherein the second sequence is subdivided into at least one first area of the second sequence and at least one second area of the second sequence, wherein at least the fifth time periods which are included in the first area of the second sequence are randomly varied deterministically or non-deterministically, and the multiplicity of sixth time periods form a third sequence for the raster area, wherein the third sequence is subdivided into at least one first area of the third sequence and at least one second area of the third sequence, wherein at least the sixth time periods which are included in the first area of the third sequence are randomly varied deterministically or non- deterministically.

15. The method according to claim 1, wherein the particle beam is guided over the raster area at least a first time in order to produce a first representation, and is guided over the raster area at least a second time in order to produce a second representation, and wherein the first representation and the second representation are combined using an averaging method or integration method to form a final representation.

16. The method according to claim 1, wherein the multiplicity of raster lines includes at least one third raster line, wherein the multiplicity of fifth time periods includes a first one of the fifth time periods between guidance of the particle beam over the first raster line and the second raster line, and a second one of the fifth time periods between guidance of the particle beam over the second raster line and the third raster line.

17. The method according to claim 16, wherein the first one of the fifth time periods is varied from the second one of the fifth time periods.

18. The non-transitory computer readable medium according to claim 10, wherein the multiplicity of raster lines includes at least one third raster line, wherein the multiplicity of fifth time periods includes a first one of the fifth time periods between guidance of the particle beam over the first raster line and the second raster line, and a second one of the fifth time periods between guidance of the particle beam over the second raster line and the third raster line.

19. The non-transitory computer readable medium according to claim 18, wherein the first one of the fifth time periods is varied from the second one of the fifth time periods.

20. The particle beam device according to claim 11, wherein the multiplicity of raster lines includes at least one third raster line, wherein the multiplicity of fifth time periods includes a first one of the fifth time periods between guidance of the particle beam over the first raster line and the second raster line, and a second one of the fifth time periods between guidance of the particle beam over the second raster line and the third raster line.

21. The particle beam device according to claim 20, wherein the first one of the fifth time periods is varied from the second one of the fifth time periods.

22. The particle beam device according to claim 12, wherein the multiplicity of raster lines includes at least one third raster line, wherein the multiplicity of fifth time periods including a first one of the fifth time periods between guidance of the particle beam over the first raster line and the second raster line, and a second one of the fifth time periods between guidance of the particle beam over the second raster line and the third raster line.

23. The particle beam device according to claim 22, wherein the first one of the fifth time periods is varied from the second one of the fifth time periods.

* * * * *